United States Patent
Akel et al.

(10) Patent No.: US 11,789,797 B2
(45) Date of Patent: *Oct. 17, 2023

(54) ERROR CONTROL FOR CONTENT-ADDRESSABLE MEMORY

(71) Applicant: Micron Technology, Inc., Boise, ID (US)

(72) Inventors: Ameen D. Akel, Rancho Cordova, CA (US); Sean S. Eilert, Penryn, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/886,253

(22) Filed: Aug. 11, 2022

(65) Prior Publication Data

US 2022/0382609 A1 Dec. 1, 2022

Related U.S. Application Data

(63) Continuation of application No. 16/553,731, filed on Aug. 28, 2019, now Pat. No. 11,436,071.

(51) Int. Cl.
*G11C 15/04* (2006.01)
*G06F 11/07* (2006.01)
(Continued)

(52) U.S. Cl.
CPC .......... *G06F 11/076* (2013.01); *G06F 11/102* (2013.01); *G11C 5/063* (2013.01); *G11C 11/409* (2013.01); *G11C 15/04* (2013.01)

(58) Field of Classification Search
CPC ............. G06F 11/076; G06F 11/102; G06F 11/1064; G11C 5/063; G11C 11/409; G11C 15/04; G11C 7/1006
(Continued)

(56) References Cited

U.S. PATENT DOCUMENTS 7,002,823 B1  2/2006  Ichiriu
7,181,568 B2  2/2007  Rosenbluth et al.
(Continued)

FOREIGN PATENT DOCUMENTS

CN  105765525 A  7/2016
JP  2002-313086 A  10/2002
(Continued)

OTHER PUBLICATIONS

Micron Technology Files European Patent Application for Error Correction for Content-Addressable Memory, Jul. 9, 2022, Global IP News. All pages. (Year: 2022).*

(Continued)

*Primary Examiner* — Michael T Tran
(74) *Attorney, Agent, or Firm* — Holland & Hart LLP

(57) ABSTRACT

Methods, systems, and devices for error control for content-addressable memory (CAM) are described. A CAM may store bit vectors as a set of subvectors, which each subvector stored in an independent aspect of the CAM, such as in a separate column or array of memory cells within the CAM. The CAM may similarly segment a queried input bit vector and identify, for each resulting input subvector, whether a matching subvector is stored by the CAM. The CAM may identify a match for the input bit vector when the number of matching subvectors satisfies a threshold. The CAM may validate a match based on comparing a stored bit vector corresponding to the identified match to the input bit vector. The stored bit vector may undergo error correction and may be stored in the CAM or another memory array, such as a dynamic random access memory (DRAM) array.

20 Claims, 13 Drawing Sheets

(51) Int. Cl.
    *G06F 11/10*           (2006.01)
    *G11C 5/06*            (2006.01)
    *G11C 11/409*       (2006.01)

(58) Field of Classification Search
    USPC .............................. 365/189.05; 714/47, 47.2
    See application file for complete search history.

(56) References Cited

U.S. PATENT DOCUMENTS

| | | | |
|---|---|---|---|
| 8,589,661 B2 * | 11/2013 | Butler | G06F 9/30152 |
| | | | 712/210 |
| 8,887,014 B2 | 11/2014 | Franceschini et al. | |
| 9,225,644 B2 | 12/2015 | Basso et al. | |
| 9,697,876 B1 | 7/2017 | Tiwari et al. | |
| 9,740,607 B2 | 8/2017 | Wheeler | |
| 9,767,878 B1 * | 9/2017 | Chih | G11C 11/1673 |
| 10,127,983 B1 | 11/2018 | Peterson et al. | |
| 10,387,251 B2 | 8/2019 | Shoham et al. | |
| 2002/0152352 A1 | 10/2002 | Ikegai et al. | |
| 2002/0181264 A1 | 12/2002 | Yanagawa | |
| 2005/0289407 A1 | 12/2005 | Noda et al. | |
| 2007/0050602 A1 | 3/2007 | Lien et al. | |
| 2008/0189513 A1 * | 8/2008 | Hutson | G06F 9/3455 |
| | | | 712/7 |
| 2009/0204785 A1 | 8/2009 | Yates et al. | |
| 2009/0249044 A1 | 10/2009 | Citron et al. | |
| 2010/0122070 A1 | 5/2010 | Guevorkian et al. | |
| 2010/0134257 A1 | 6/2010 | Puleston et al. | |
| 2011/0194325 A1 | 8/2011 | Ramaraju et al. | |
| 2013/0282943 A1 * | 10/2013 | Salter, III | H03K 19/17768 |
| | | | 710/200 |
| 2015/0120754 A1 | 4/2015 | Chase et al. | |
| 2016/0048709 A1 | 2/2016 | Butler et al. | |
| 2016/0098200 A1 | 4/2016 | Guz et al. | |
| 2016/0321480 A1 | 11/2016 | Hamlin et al. | |
| 2017/0031759 A1 | 2/2017 | Galbraith et al. | |
| 2017/0046395 A1 | 2/2017 | Li et al. | |
| 2017/0242799 A1 * | 8/2017 | O'Krafka | G06F 12/10 |
| 2017/0249562 A1 * | 8/2017 | Garvey | G06N 5/047 |
| 2017/0270323 A1 | 9/2017 | Butler et al. | |
| 2018/0144782 A1 * | 5/2018 | Noguchi | H10B 61/22 |
| 2018/0173677 A1 | 6/2018 | Muralimanohar | |
| 2019/0097652 A1 | 3/2019 | Xiong et al. | |
| 2019/0140829 A1 | 5/2019 | Kurdziel et al. | |
| 2019/0164600 A1 | 5/2019 | Castro | |
| 2019/0164611 A1 | 5/2019 | Castro | |
| 2019/0196715 A1 | 6/2019 | Miki | |
| 2019/0206716 A1 * | 7/2019 | Kim | H01L 29/7827 |
| 2020/0066968 A1 * | 2/2020 | Park | H10N 50/85 |
| 2020/0204971 A1 | 6/2020 | Yasukawa et al. | |
| 2020/0365795 A1 * | 11/2020 | Chuang | H10N 50/01 |
| 2021/0065754 A1 | 3/2021 | Troia | |
| 2021/0065767 A1 | 3/2021 | Troia | |
| 2021/0072986 A1 | 3/2021 | Yudanov et al. | |
| 2021/0311824 A1 | 10/2021 | Fackenthal et al. | |
| 2022/0084574 A1 * | 3/2022 | Iwayama | G11C 11/1675 |

FOREIGN PATENT DOCUMENTS

| | | | | |
|---|---|---|---|---|
| JP | 2002-358791 A | 12/2002 | | |
| JP | 2005-353238 A | 12/2005 | | |
| JP | 2010-049722 A | 3/2010 | | |
| JP | 6203905 B2 | 9/2017 | | |
| TW | 201126329 A | 8/2011 | | |
| TW | I484330 B | 5/2015 | | |
| TW | I605460 B | 11/2017 | | |
| WO | WO-2007051205 A1 * | 5/2007 | ......... | G06F 12/1027 |
| WO | 2010/050282 A1 | 5/2010 | | |

OTHER PUBLICATIONS

International Search Report and Written Opinion received for PCT Patent Application No. PCT/US20/46784, dated Nov. 17, 2020, 8 pages.

Taiwan Intellectual Property Office, "Office Action," issued in connection with ROC (Taiwan) Patent Application No. 109127018, dated Apr. 16, 2021 (5 pages).

Japanese Patent Office, "Office Action," issued in connection with Japan Patent Application No. 2022-513056 dated Apr. 4, 2023 (13 pages) (7 pages of English Translation and 6 pages of Original Document).

European search report dated Jun. 27, 2023 for EP Application No. 20858112, 9 page(s).

* cited by examiner

ERROR CONTROL FOR CONTENT-ADDRESSABLE MEMORY

CROSS REFERENCE

The present application for patent is a continuation of U.S. patent application Ser. No. 16/553,731 by Akel et al., entitled "ERROR CONTROL FOR CONTENT-ADDRESSABLE MEMORY," filed Aug. 28, 2019, assigned to the assignee hereof, and is expressly incorporated by reference in its entirety herein.

BACKGROUND

The following relates generally to a system that includes at least one memory device and more specifically to error control for content-addressable memory (CAM).

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

In some cases, a memory device may receive data from a host device. The memory device may determine whether the data is within the memory device by reading each address in each memory array of the memory device. If any data retrieved from any address matches the data received from the host device, the memory device may determine that there is a match and may transmit an indication of the match to the host device.

DETAILED DESCRIPTION

Figure 1:
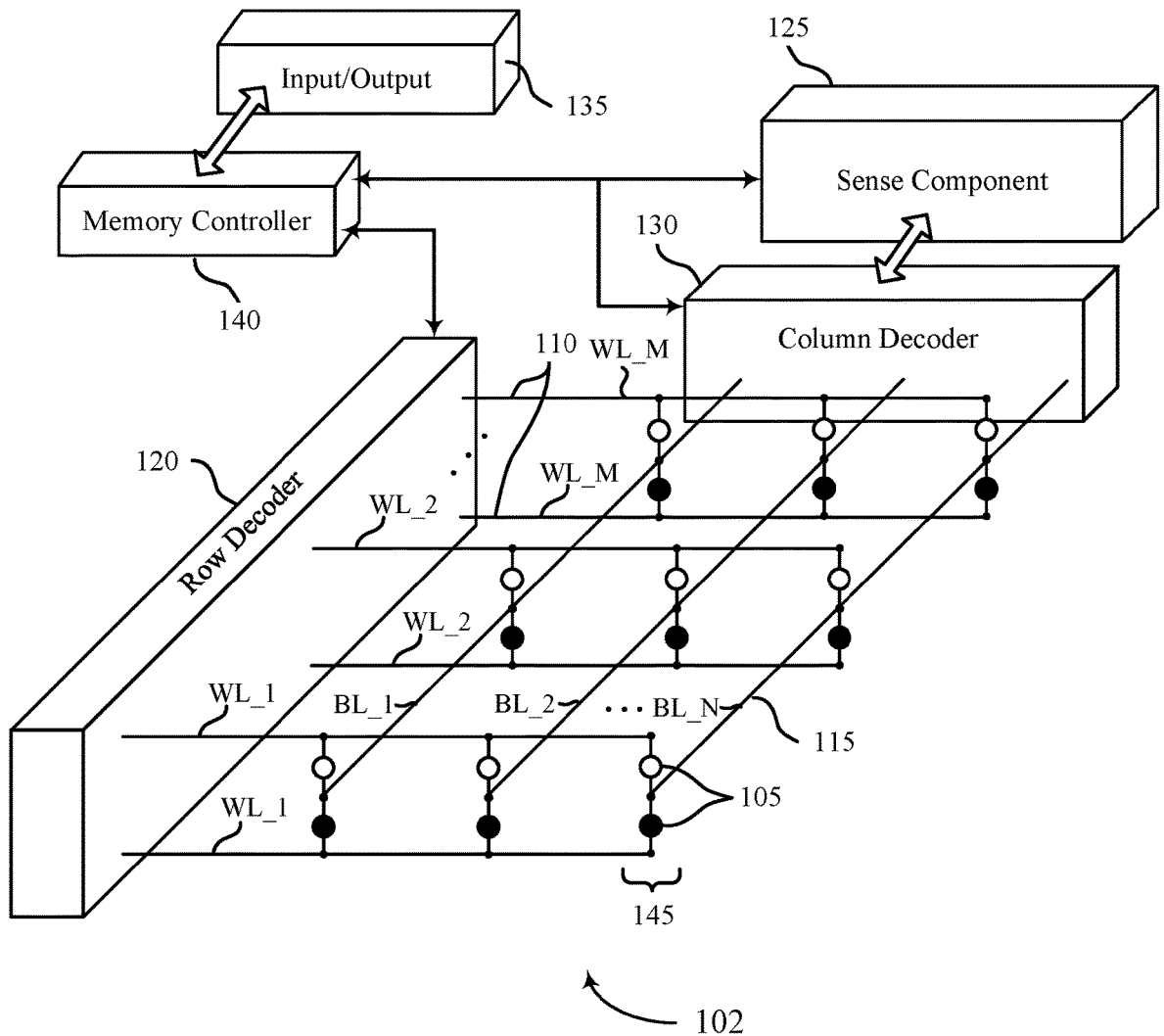
FIG. 1 illustrates an example memory device supports error control for content-addressable memory (CAM) in accordance with examples as disclosed herein.

In some cases, a memory device (e.g., a content-addressable memory (CAM) memory device) may determine whether a received bit vector of data matches any bit vectors stored at the memory device. One such method may include feeding signals corresponding to the received bit vector into one or more memory arrays of the memory device and determining whether the received bit vector matches any stored bit vectors based on cell behavior in response to the signals (e.g., snapback behavior). For instance, the signals may be fed into an array of the memory device via one or more row lines (e.g., word lines). If any of the memory cells along the row line exhibit snapping behavior, the memory device may identify bit vectors stored at column lines coupled with those memory cells as mismatches (e.g., may determine that those column lines do not contain memory cells storing a bit vector that matches with the received bit vector). Any bit vectors stored at columns whose memory cells do not exhibit snapping behavior for any of their memory cells may be considered a match. The memory device may provide an indication of this match to an external device (e.g., a host device).

In some cases, a column whose memory cells store a bit vector matching the received bit vector may have a memory cell that erroneously snaps upon application of the signals. As such, the memory device may identify the bit vector at that column line as a mismatch although the stored bit vector of that column line matches the received bit vector—that is, a false negative may occur. General methods of preventing errors may involve adding parity to the stored bit vector. However, as it is possible that one of the memory cells corresponding to the parity may erroneously snap, adding parity may increase the chance of a mismatch and thereby increase rather than decrease the risk of false negatives. Additionally, there may be cases where the memory device experiences device failure during the matching process, in which case the match may not be successfully retrieved.

To address the erroneous snapback behavior and/or device failure, a memory device may store bit vectors each across multiple columns, arrays, or memory devices as a set of bit subvectors, where each column, array, or memory device may be associated with a different one of the set of bit subvectors. In such cases, determining whether a received bit vector matches any stored bit vectors may involve segmenting the received vector into a set of bit subvectors and feeding signals corresponding to each bit subvector into one or more memory arrays or memory devices. Even if one or more of the columns, arrays, or memory devices has a memory cell that erroneously snaps, the other columns may be correctly identified as matches for the other bit subvectors. As such, if a threshold number of columns, arrays, or memory devices (e.g., all except one) indicate matches, the memory device may determine that the bit subvectors stored at the set of columns are a match with the received vector.

Features of the disclosure are initially described in the context of a memory system and memory die as described with reference to FIGS. 1 and 2. Features of the disclosure are described in the context of a CAM, a vector matching operation, a bit subvector matching operation, bit vectors, a media management system, and a matching process flow as described with reference to FIGS. 3-8. These and other features of the disclosure are further illustrated by and described with reference to an apparatus diagram and flowcharts that relate to error control for CAM as described with references to FIGS. 9-13.

FIG. 1 illustrates an example memory device 100 in accordance with examples as disclosed herein. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not actual physical positions within the memory device 100. In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store one of two states, denoted as a logic 0 and a logic 1. In some examples, a memory cell 105 may be configured to store one of more than two logic states. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the number of levels is not limited to two and may in some cases be one or more than two. Each level may be aligned or positioned so that memory cells 105 may be aligned (exactly, overlapping, or approximately) with one another across each level, forming a memory cell stack 145. In some cases, the memory cell stack 145 may include multiple memory cells 105 laid on top of another while sharing an access line. The memory cells 105 may in some cases be configured to each store one bit of data.

A memory cell 105 may, in some examples, be a self-selecting memory cell and/or may be not-and (NAND) flash memory cells. A self-selecting memory cell 105 may include one or more components of a material (e.g., a chalcogenide material) that each function both as a storage element and as a cell selector (selection) element, thereby eliminating the need for separate cell selector circuitry (a selector circuitry that does not contribute to storage). Such an element may be referred to as a storage and selector component (or element), or as a self-selecting memory component (or element). In contrast, other types of memory cells, such as dynamic random access memory (DRAM) or phase change memory (PCM) cells, may each include a separate (dedicated) cell selector element such as a three-terminal selector element (e.g., a transistor) to select the memory cell without contributing to the storage of any logic state. These separate selector elements may be fabricated underneath the DRAM or PCM memory cells, for example.

In some cases, a memory cell 105 may be configured to exhibit snapback behavior. Snapback behavior may be a response that a memory cell 105 exhibits along a column line 115 when receiving an electrical pulse along a row line 110. Snapback behavior may occur in part due to a threshold voltage of a memory cell 105 configured when the memory cell 105 receives a write voltage of a certain polarity. For instance, the threshold voltage of the memory cell 105 may be at a first value when the write voltage has a first polarity, which may correspond to a first logic state, and the threshold voltage of the memory cell 105 may be at a second value when the write voltage has a second polarity, which may correspond to a second logic state.

Memory array 102 may include multiple row lines 110 (e.g., word lines) for each deck, labeled WL_1 through WL_M, and multiple column lines 115, labeled BL_1 through BL_N, where M and N depend on the array size. In some examples, each row of memory cells 105 is connected to a row line 110, and each column of memory cells 105 is connected to a column line 115. In some cases, row lines 110 and column lines 115 may be referred to as access lines because they may permit access to memory cells 105. In some examples, column lines 115 may also be known as digit lines 115. References to access lines, row lines, and column lines, or their analogues, are interchangeable without loss of understanding or operation. Activating or selecting a row line 110 or a column line 115 may include applying a voltage to the respective line. Row lines 110 and column lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Row lines 110 and column lines 115 may be substantially perpendicular to one another and may create an array of memory cells. As shown in FIG. 1, the two memory cells 105 in a memory cell stack 145 may share a common conductive line such as a column line 115. That is, a column line 115 may be in electronic communication with the bottom electrode of the upper memory cell 105 and the top electrode of the lower memory cell 105. Other configurations may be possible, for example, a third layer may share an access line 110 with a lower layer. In general, one memory cell 105 may be located at the intersection of two conductive lines such as a row line 110 and a column line 115. This intersection may be referred to as an address of a memory cell 105. A target memory cell 105 may be a memory cell 105 located at the intersection of an energized row line 110 and column line 115; that is, row line 110 and column line 115 may be energized to read or write a memory cell 105 at their intersection. Other memory cells 105 that are in electronic communication with (e.g., connected to) the same row line 110 or column line 115 may be referred to as untargeted memory cells 105. In some cases, one or more of the column lines 115 may be configured to each store a respective bit vector or a bit subvector of data. For instance, each memory cell 105 coupled with a column line 115 may store an information bit of the bit vector or bit subvector. In some cases, a bit vector may be referred to as a key and a subvector may be referred to as a subkey.

Electrodes may be coupled to a memory cell 105 and a row line 110 or a column line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include multiple self-selecting memory components separated from each other and from access lines 110, 115 by electrodes. As previously noted, for self-selecting memory cells 105, a single component (e.g., a section or layer of chalcogenide material within the memory cell 105) may be used as both a storage element (e.g., to store or contribute to the storage of a state of memory cell 105) and as a selector element (e.g., to select or contribute to the selection of the memory cell 105).

One side of a first electrode may be coupled to a row line 110 and the other side of the first electrode to a self-selecting memory component. In addition, one side of a second electrode may be coupled to a column line 115 and the other side of the second electrode to the self-selecting memory component. The first and second electrodes may be the same material (e.g., carbon) or of various (different) materials. In some cases, the electrodes may be a different material than the access lines. In some examples, the electrodes may shield a material (e.g., a chalcogenide material) included in a self-selecting memory component from the row line 110, from the column line 115, and from each other to prevent chemical interaction between the material and the row line 110, the column line 115, or another—selecting memory component.

Operations such as reading and writing may be performed on memory cells 105 by activating or selecting a corresponding row line 110 and column line 115. Accessing memory cells 105 may be controlled through a row decoder 120 and a column decoder 130. For example, a row decoder 120 may receive a row address from the memory controller 140 and activate the appropriate row line 110 based on the received row address. Such a process may be referred to as decoding a row or word line address. Similarly, a column decoder 130 may receive a column address from the memory controller 140 and activate the appropriate column line 115. Such a process may be referred to as decoding a column or bit line address. A row decoder 120 and/or column decoder 130 may be examples of decoders implemented using decoder circuitry, for example. In some cases, row decoder 120 and/or column decoder 130 may include charge pump circuitry that is configured to increase a voltage applied to a row line 110 or column line 115 (respectively).

Additionally, if the memory array 102 is in a CAM, the memory array 102 may take part in a query or matching procedure. A query procedure may involve activating each row line 110 of the memory array 102 according to a bit vector or bit subvector received at the CAM. Depending on a behavior of memory cells 105 along the row lines 110, the CAM may determine if column lines 115 coupled with the memory cells 105 contain a bit vector or bit subvector that matches the received bit vector or bit subvector. For instance, if a memory cell 105 coupled with a column line 115 exhibits snapback behavior, the CAM may determine that the column line 115 does not contain memory cells storing the bit vector or bit subvector that matches the received bit vector or bit subvector. If none of the memory cells 105 exhibit snapback behavior, the CAM may determine that column line 115 does contain memory cells storing the bit vector or bit subvector that matches the received bit vector or bit subvector.

A memory cell 105 may be read (e.g., sensed) by a sense component 125 when the memory cell 105 is accessed (e.g., in cooperation with the memory controller 140, row decoder 120, and/or column decoder 130) to determine a logic state stored by the memory cell 105. The sense component 125 may provide an output signal indicative of (e.g., based at least in part on) the logic state stored by the memory cell 105 to one or more components (e.g., to the column decoder 130, the input/output component 135, the memory controller 140). In some examples, the detected logic state may be provided to a host device (e.g., a device that uses the memory device 100 for data storage, a processor coupled with the memory device 100 in an embedded application), where such signaling may be provided directly from the input/output component 135 or via the memory controller 140.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. An ordinary person skilled in the art would appreciate that sense component may be associated either with column decoder or row decoder without losing its functional purpose.

In some memory architectures, accessing a memory cell 105 may degrade or destroy a logic state stored by one or more memory cells 105, and rewrite or refresh operations may be performed to return the original logic state to the memory cells 105. In architectures that include a material portion for logic storage, for example, sense operations may cause a change in the atomic configuration or distribution of a memory cell 105, thereby changing the resistance or threshold characteristics of the memory cell 105. Thus, in some examples, the logic state stored in a memory cell 105 may be rewritten after an access operation.

In some examples, reading a memory cell 105 may be non-destructive. That is, the logic state of the memory cell 105 may not need to be rewritten after the memory cell 105 is read. For example, in architectures that include a material portion for logic storage, sensing the memory cell 105 may not destroy the logic state and, thus, a memory cell 105 may not need rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write or refresh pulse or bias to maintain stored logic states. Refreshing a memory cell 105 may reduce or eliminate read disturb errors or logic state corruption.

Figure 2:
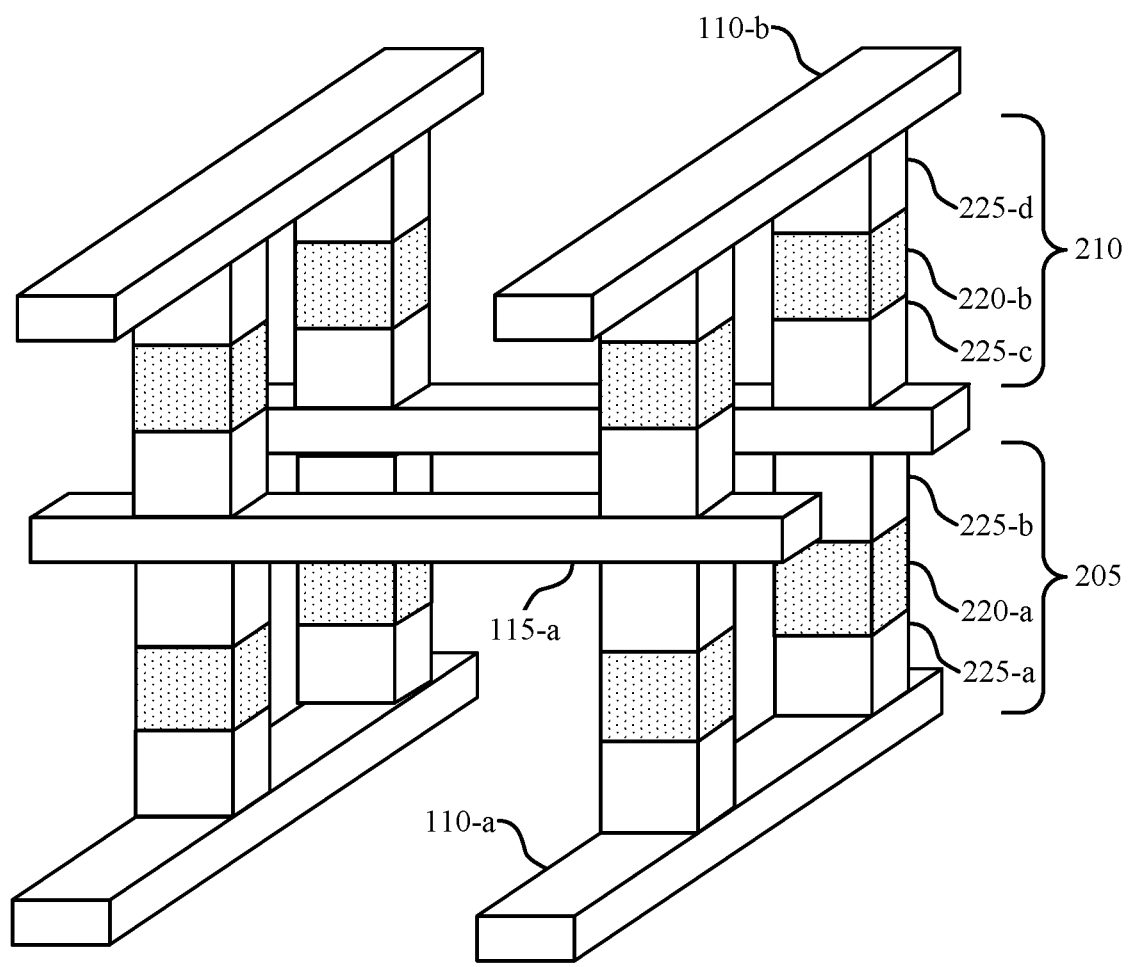
FIG. 2 illustrates an example of a memory array that supports error control for CAM in accordance with examples as disclosed herein.

FIG. 2 illustrates an example of a 3D memory array 200 that supports multi-component cell architectures for a memory device in accordance with examples as disclosed herein. Memory array 200 may be an example of portions of memory array 102 described with reference to FIG. 1. Memory array 200 may include a first array or deck 205 of memory cells that is positioned above a substrate 204 and second array or deck 210 of memory cells on top of the first array or deck 205. Though the example of memory array 200 includes two decks 205, 210, it is to be understand that one deck (e.g., a 2D memory array) or more than two decks are also possible.

Memory array 200 may also include row line 110-*a* and row line 110-*b*, and column line 115-*a*, which may be examples of row line 110 and column line 115, as described with reference to FIG. 1. Memory cells of the first deck 205 and the second deck 210 each may include one or more self-selecting memory cells. Although some elements included in FIG. 2 are labeled with a numeric indicator, other corresponding elements are not labeled, though they are the same or would be understood to be similar, in an effort to increase visibility and clarity of the depicted features.

Memory cells of the first deck 205 may include first electrode 225-a, a self-selecting memory material 220-a, and a second electrode 225-b. In addition, memory cells of the second deck 210 may include a first electrode 225-c, a self-selecting memory material 220-b, and a second electrode 225-d. The memory cells of the first deck 205 and second deck 210 may, in some examples, have common conductive lines such that corresponding memory cells of each deck 205 and 210 may share column lines 115 or row lines 110 as described with reference to FIG. 1. For example, first electrode 225-c of the second deck 210 and the second electrode 225-b of the first deck 205 may be coupled to column line 115-a such that column line 115-a is shared by vertically adjacent memory cells.

In some examples, the self-selecting memory material 220 may, for example, be a chalcogenide or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some other examples, a SAG-alloy may also contain indium (In), and such chalcogenide material may in some cases be referred to as InSAG-alloy. In some examples, a chalcogenide may include additional elements such as hydrogen (H), oxygen (O), nitrogen (N), chlorine (Cl), or fluorine (F), each in atomic or molecular forms.

In some cases, the self-selecting memory material 220 used in a self-selecting memory cell may be based on an alloy (such as the alloys listed above) and may be operated so as to not undergo a phase change during normal operation of the memory cell (e.g., due to the composition of the chalcogenide material, and/or due to operational voltages and currents configured to maintain the self-selecting memory material 220 in a single phase, such as an amorphous or glass phase). For example, the self-selecting memory material 220 may include a chemical element, such as arsenic, that inhibits crystallization of the chalcogenide material and thus may remain in an amorphous state. Here, some or all of the set of logic states supported by the memory cells (e.g., including self-selecting memory material 220 and electrodes 225) may be associated with an amorphous state of the self-selecting memory material 220 (e.g., stored by the self-selecting memory material 220 while the self-selecting memory material 220 is in the amorphous state). For example, a logic state '0' and a logic state '1' may both be associated with an amorphous state of the self-selecting memory material 220 (e.g., stored by the self-selecting memory material 220 while the self-selecting memory material 220 is in the amorphous state). In some cases, self-selecting memory material 220 may be configured to store a logic state corresponding to an information bit of a bit vector or bit subvector.

During a programming (write) operation of a memory cell (e.g., including electrodes 225 a, self-selecting memory material 220 a, and electrode 225 b), the polarity used for programming (writing) may influence (determine, set, program) a particular behavior or characteristic of the self-selecting memory material 220, such as the threshold voltage of the self-selecting memory material 220. The difference in threshold voltages of the self-selecting memory material 220 depending on the logic state stored by the self-selecting memory material 220 (e.g., the difference between the threshold voltage when the self-selecting memory material 220 is storing a logic state '0' versus a logic state '1') may correspond to the read window of the self-selecting memory material 220.

The architecture of memory array 200 may be referred to as a cross-point architecture, in some cases, in which a memory cell is formed at a topological cross-point between a row line and a column line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture. Alternatively, DRAM memory cells may include the cell selector elements underneath the memory cells.

While the example of FIG. 2 shows two memory decks, other configurations are possible. In some examples, a single memory deck of memory cells may be constructed above a substrate 204, which may be referred to as a two-dimensional memory. In some examples, two or more decks of memory cells may be configured in a similar manner in a three-dimensional cross point architecture.

Figure 3:
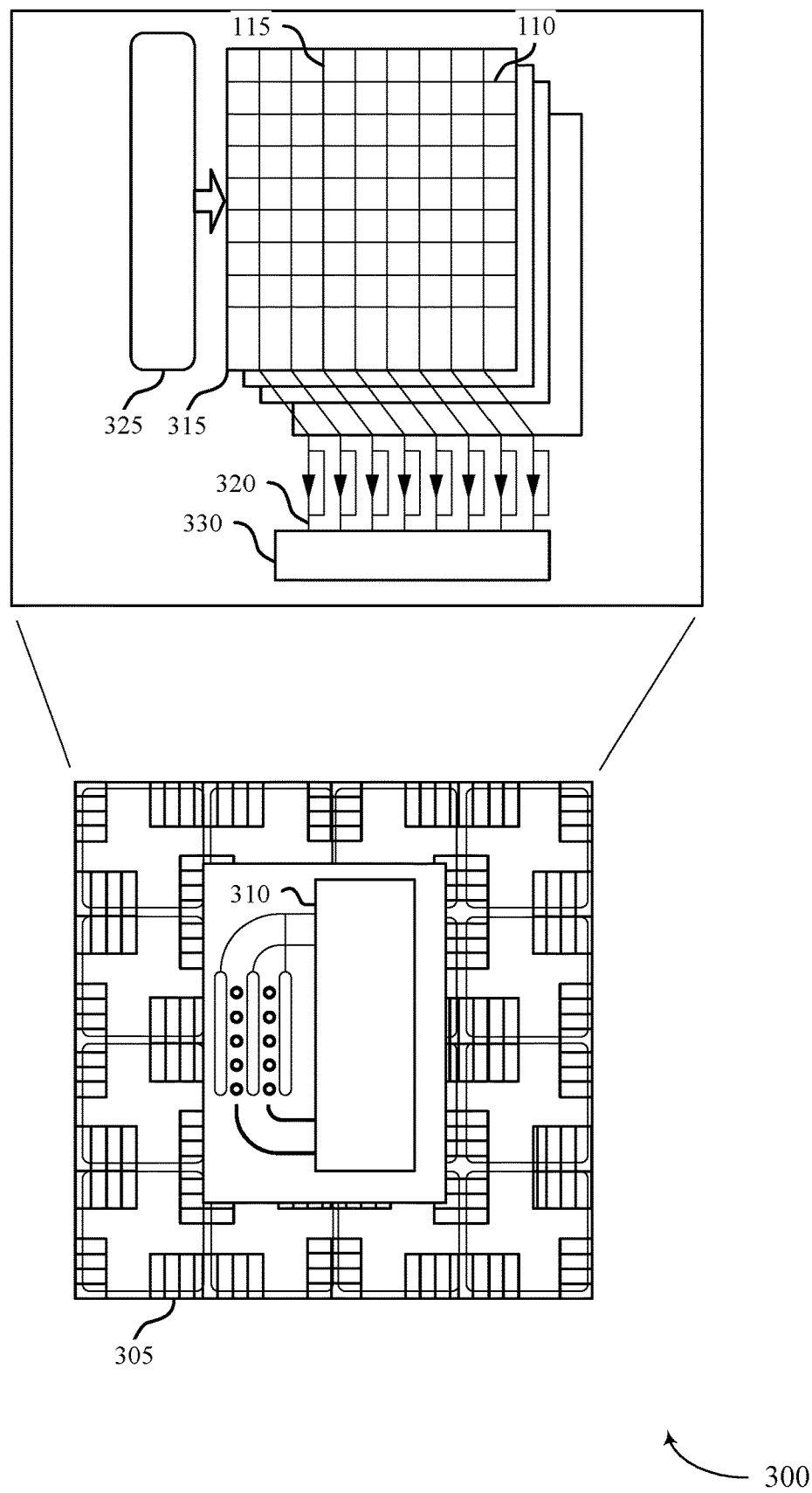
FIG. 3 illustrates an example of a CAM operation that supports error control for CAM in accordance with examples as disclosed herein.

FIG. 3 illustrates an example of a CAM operation 300 that supports error control for CAM in accordance with examples as disclosed herein. Generally, a CAM 305 may be configured to receive a bit vector (e.g., input bit vector 325) and to compare the received bit vector with one or more bit vectors stored at the CAM 305. The CAM 305 may determine whether the received bit vector matches any bit vectors stored within one or more memory arrays of the CAM 305. If the received bit vector matches a stored bit vector at the CAM 305, the CAM 305 may output an address of the stored bit vector. In some cases, the CAM 305 may contain crosspoint memory 310. In some cases, the CAM 305 may also be referred to as an associative pattern memory (APM).

The CAM 305 may contain one or more memory arrays 315, which may also be referred to as tiles 315. Each memory array 315 may be an example of a 3D memory array 102 or 200 or a deck thereof as described with reference to FIG. 1 or FIG. 2 and may contain memory cells, row lines 110 and column lines 115. The memory arrays 315 may be stacked on top of each other. In some cases, the memory arrays 315 may be configured such that each column line 115 in a memory array 315 may be aggregated with a column line 115 in each other memory array 315 to form matching line 320. Each column line 115 of a memory array 315 may be coupled with memory cells that store a bit vector.

In some examples, an input bit vector 325 may be applied to a first of the one or more memory arrays 315. The input bit vector 325 may be a bit vector received by the CAM 305 and may consist of one or more information bits. Applying the input bit vector 325 may involve applying a signal (e.g., an electrical pulse) for each information bit along a respective row line 110 for the first memory array 315. For instance, a signal for a first information bit of input bit vector 325 may be applied along a first row line 110 of the first memory array 315 and a signal for a second information bit of input bit vector 325 may be applied along a second row line 110 of the first memory array 315. In general, the signal applied for an information bit in a first logical state (e.g., a low logical state, such as 0) may have different characteristics than a signal applied for an information bit in a second logical state (e.g., a high logical state, such as 1). Such differences in characteristic may include signal polarity, pulse duration, pulse application start time, and pulse application end time.

Upon application of the input bit vector 325, the CAM 305 may generate a matching vector 330 which indicates whether memory cells of a column line 115 contain a match to input bit vector 325. The CAM 305 may determine the matching vector 330 based on whether snapback behavior is exhibited (e.g., based upon the presence or absence of snapback behavior) by memory cells in a column line 115 upon application of the input bit vector 325. Exhibiting snapback behavior may involve, for instance, a memory cell outputting a signal over a corresponding column line 115 to matching line 320 upon receiving a signal associated with the input bit vector 325 from a corresponding row line 110. The matching vector 330 may contain entries corresponding to mismatches for column lines 115 whose memory cells exhibit snapback behavior and may contain one or more entries corresponding to matches for column lines 115 with no memory cells exhibiting snapback behavior.

After generating the matching vector 330 for the first memory array 315, the CAM 305 may output addresses of one or more column lines 115 corresponding to the entries in matching vector 330 indicating a match. The CAM 305 may proceed to generate matching vectors 330 for the other memory arrays 315 in a similar manner as described herein and may likewise output addresses corresponding to the entries in those matching vectors 330.

In some cases, the CAM 305 may receive a bit vector to store. To store the bit vector, the CAM 305 may store received data into a next free location in the memory array 315.

Figure 4:
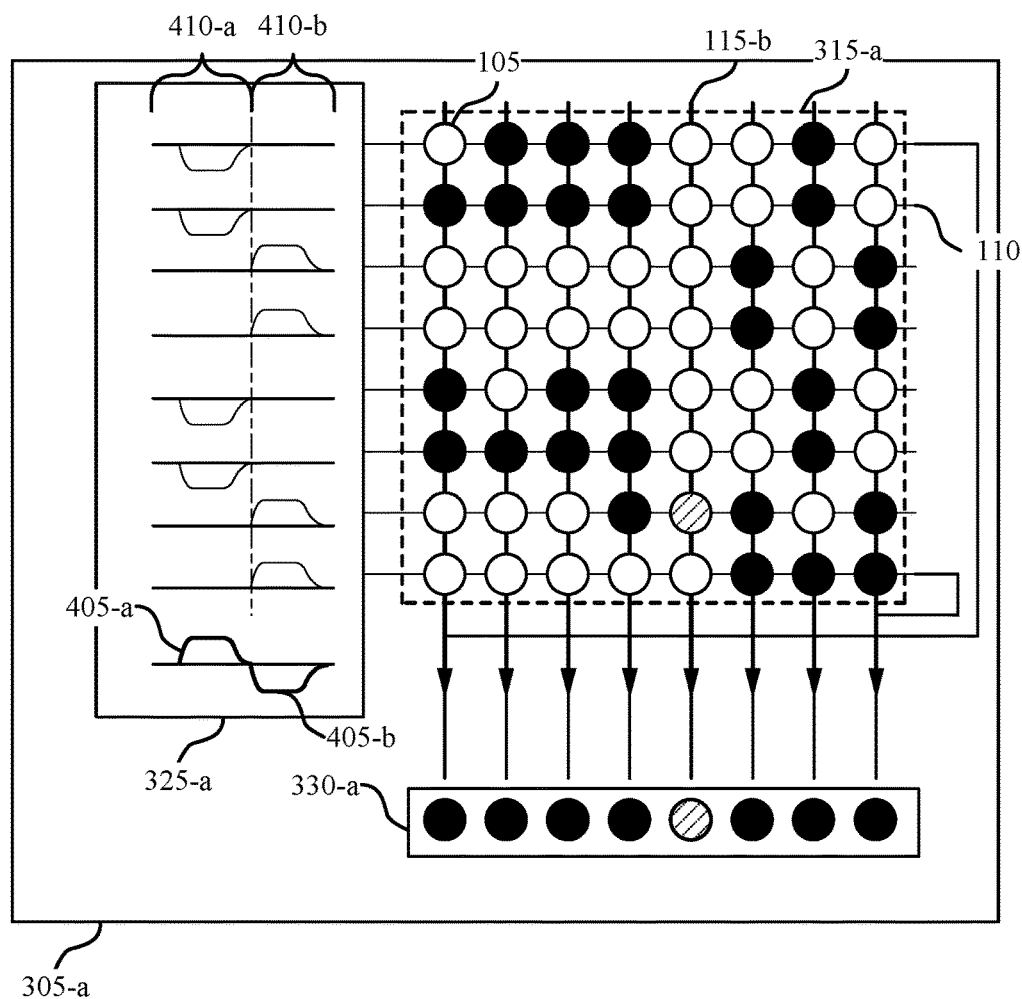
FIG. 4 illustrates an example of a vector matching operation that supports error control for CAM in accordance with examples as disclosed herein.

FIG. 4 illustrates an example of a vector matching operation 400 that supports error control for CAM in accordance with examples as disclosed herein. In some examples, column line 115-*b* may be an example of a column line 115 as described with reference to FIG. 1. Additionally, CAM 305-*a*, memory array 315-*a*, input bit vector 325-*a*, and matching vector 330-*a* may be examples of a CAM 305, a memory array 315, an input bit vector 325, and a matching vector 330 as described with reference to FIG. 3. Vector matching operation 400 may represent a situation in which a stored bit vector that matches a received bit vector may be misidentified as a mismatch.

CAM 305-*a* may contain a memory array 315-*a*. Memory array 315-*a* may contain memory cells 105 coupled with row lines 110 and column lines 115 as described with reference to FIG. 1 or FIG. 2. The row lines 110 may be configured to receive an input bit vector 325 as described with reference to FIG. 3. The column lines 115 may be coupled with respective matching lines 320 and may be configured to output signals corresponding to a matching vector 330 as described with reference to FIG. 3.

In some examples, a different information bit of input bit vector 325-*a* may be applied to each row line 110 of memory array 315-*a* in the form of an electrical pulse 405. If an information bit of input bit vector 325-*a* indicates a first logical state (e.g., a 0), the corresponding electrical pulse 405 may have a first polarity and may be applied in a first phase 410, where a phase 410 may refer to a window of time. If an information bit of input bit vector 325-*a* indicates a second logical state (e.g., a 1), the corresponding electrical pulse 405 may have a second polarity and a second phase 410, where at least one of the second polarity and second phase 410 may be different from the first polarity or first phase 410. In the present example, information bits of input bit vector 325-*a* may correspond to electrical pulse 405-*a* in phase 410-*a* with a positive polarity or electrical pulse 405-*b* in phase 410-*b* with a negative polarity.

Upon application of signals corresponding to input bit vector 325-*a*, memory cells 105 receiving the signals may or may not exhibit snapback behavior depending on values of information bits stored by the memory cells 105. For instance, a first memory cell 105 may receive a signal corresponding to input bit vector 325-*a* along a row line 110. If a value of the information bit stored at the first memory cell 105 is the same as a value of the information bit corresponding to the signal, the first memory cell may not exhibit snapback behavior and may be a match. If the values are different, the first memory cell 105 may exhibit snapback behavior and may be a mismatch. Column lines 115 coupled with any memory cells 105 exhibiting snapback behavior may have a corresponding mismatch entry in matching vector 330-*a* and column lines 115 coupled with memory cells 105 where none of the memory cells 105 exhibit snapback behavior may have a corresponding match entry in matching vector 330-*a*.

However, in some instances, a memory cell 105 may exhibit snapback behavior when the memory cell 105 contains an information bit with a same value as the information bit corresponding to the applied signal. One such example may be demonstrated by column line 115-*b*, which may contain memory cells 105 storing a bit vector that matches with input bit vector 325-*a*. However, column line 115-*b* may also contain a memory cell 105 that erroneously exhibits snapback behavior upon receiving electrical pulse 405-*b*. In such cases, matching vector 330-*a* may erroneously indicate that the bit vector stored in memory cells 105 of column line 115-*b* does not match input bit vector 325-*a*. As such, the CAM 305 may fail to retrieve the address corresponding to input bit vector 325-*a*.

Figure 5:
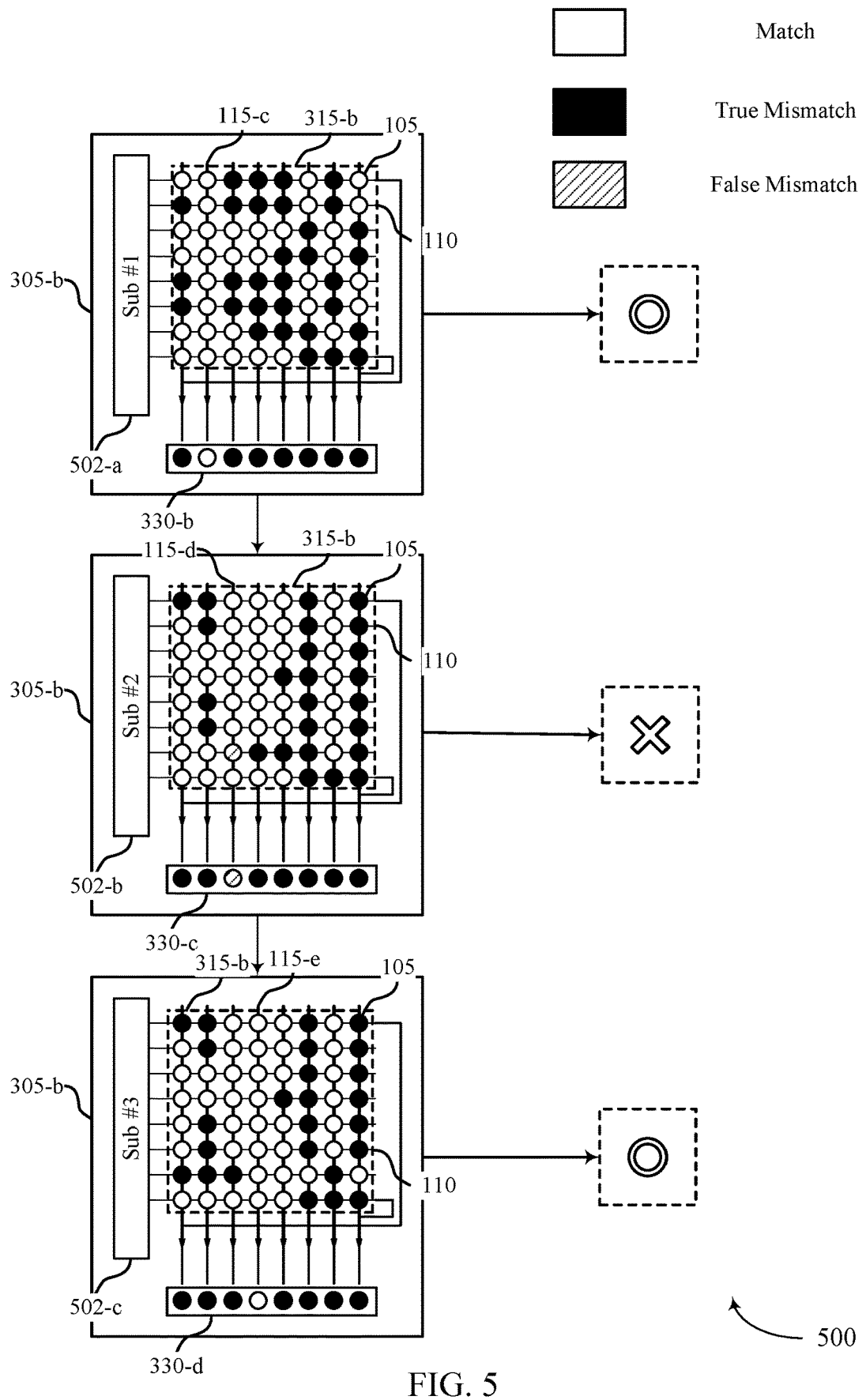
FIG. 5 illustrates an example of a subvector matching operation that supports error control for CAM in accordance with examples as disclosed herein.

FIG. 5 illustrates an example of a subvector matching operation 500 that supports error control for CAM in accordance with examples as disclosed herein. In some examples, column lines 115-*c*, 115-*d*, and 115-*e* may be an example of column lines 115 as described with reference to FIG. 1. CAM 305-*b* and memory array 315-*b* may be examples of a CAM 305 and a memory array 315, respectively, as described with reference to FIG. 3. Matching vectors 330-*b*, 330-*c*, and 330-*d* may be examples of matching vectors 330 as described with reference to FIG. 3.

CAM 305-*b* may contain memory cells 105 coupled with row lines 110 and column lines 115 as described with reference to FIG. 1. The row lines 110 may be configured to receive an input bit vector 325 as described with reference to FIGS. 3 and 4. The column lines 115 may be coupled with respective matching lines 320 and may be configured to output signals corresponding to a matching vector 330 as described with reference to FIG. 3. In some cases, CAMs 305-*a* and 305-*b* may be a same CAM 305 with a different encoding scheme.

In some cases, CAM 305-*b* may receive a bit vector to store. To store the bit vector, CAM 305-*b* may segment the received bit vector into one or more bit subvectors and may write each of the one or more bit subvectors to a next (or other) available column. In some cases, the one or more bit subvectors may be in consecutive columns. For instance, a first bit subvector of a bit vector may be stored at column line 115-c, a second bit subvector of the bit vector may be stored at column line 115-d, and a third bit subvector of the bit vector may be stored at column line 115-e. Each bit subvector may have a same size as a stored bit vector of CAM 305-a. As such, the bit vector to which the bit subvectors correspond may have a larger size (e.g., 3 times as large) than a stored bit vector of CAM 305-a. Additionally, in some cases, CAM 305-b may identify a parity bit subvector and may write the parity bit subvector to a next (or other) available column. In some cases, the parity bit subvector may be written in a column consecutive with the columns of the one or more bit subvectors. More details regarding parity bit subvectors may be described with reference to FIG. 6A.

In some examples, CAM 305-b may receive a bit vector and may segment the bit vector into bit subvectors 502-a, 502-b, and 502-c. Bit subvectors 502-a, 502-b, and 502-c, in the present example, may each be the same size as input bit vector 325-a of FIG. 4, but the bit vector which the bit subvectors 502 make up may be larger (e.g., three times as large).

CAM 305-b may determine whether bit subvectors 502-a, 502-b, and 502-c match corresponding bit subvectors stored in memory array 315-b. In some examples, bit subvectors 502 may be fed input into memory array 315-b in a similar fashion as the input vectors 325 described with reference to FIG. 3. In one example, CAM 305-b may input bit subvector 502-a into memory array 315-b along row lines 110 and may generate matching vector 330-b. Matching vector 330-b may indicate that bit subvector 502-a has a match stored in memory cells 105 of column line 115-c. In some cases, CAM 305-b may transmit an address or index of column line 115-c to a higher device or system (e.g., a field-programmable gate array (FPGA)). More details about the higher device or system may be described with reference to FIGS. 7 and 8.

Additionally, CAM 305-b may input bit subvector 502-b into memory array 315-b along row lines 110 and may generate matching vector 330-c. Column line 115-d may contain memory cells 105 storing a bit subvector which matches bit subvector 502-b. However a memory cell 105 of column line 115-d may errantly exhibit snapbacking behavior upon receiving a signal corresponding to input bit subvector 502-b. As such, matching vector 330-c may indicate that no match exists in memory array 315-b. In some such cases, CAM 305-b may not transmit an address or index of column line 115-c to the higher device or system.

Additionally, CAM 305-b may input bit subvector 502-c into memory array 315-b along row lines 110 and may generate matching vector 330-d. Matching vector 330-d may indicate that bit subvector 502-c has a match stored in memory cells 105 of column line 115-e. In some cases, CAM 305-b may transmit an address or index of column line 115-e to a higher device or system (e.g., an FPGA, processor, or controller).

In some cases, CAM 305-b may resolve each bit subvector 502. For instance, CAM 305-b may generate matching vectors 330-a, 330-b, and 330-c, and may determine if the number of matching vectors 330 that indicate a stored match are at or above a threshold number. If the number of matching vectors 330 are at or above the threshold, CAM 305-b may provide an indication of the match to a higher device or system (e.g., an FPGA, processor, or controller).

Alternatively, if the number of matching vectors are below the threshold, CAM 305-b may provide an indication of a mismatch to the higher device or system.

The columns 115 in which the different bit subvectors of a same bit vector are stored need not all be in the same memory array 315. For example, a bit vector may be stored across multiple memory arrays 315. For instance, a first bit subvector of a bit vector may be stored in a first memory array 315 (e.g., in a column 115 within the first memory array 315), a second bit subvector of a bit vector may be stored in a second memory array 315 (e.g., in a column 115 within the second memory array 315), and a third bit subvector of a bit vector may be stored in a third memory array 315 (e.g., in a column 115 within the third memory array 315). In such cases, CAM 305-b may input bit subvectors 502-a, 502-b, and 502-c into each memory array and may, accordingly, output an address or index for column lines 115 in the first memory array 315, the second memory array 315, and the third memory array 315. If one of the memory cells associated with the matching column line 115 in one of the memory arrays 315 exhibits snapback behavior, CAM 305-b may not transmit an address or index for that column line 115 in that memory array 315. Further, the columns 115 (and by extension, memory arrays 315) in which the different bit subvectors of a same bit vector are stored need not all be in the same CAM 305 or memory device, but may instead be distributed across any number of CAMs 305 or memory devices.

Figure 6A:
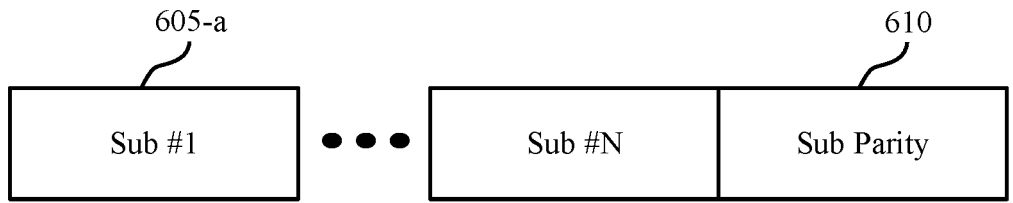
FIGS. 6A and 6B illustrate examples of vectors that support error control for CAM in accordance with examples as disclosed herein.

FIG. 6A illustrates an example of a bit vector 600-a that supports error control for CAM in accordance with examples as disclosed herein. Bit vector 600-a may be an example of a bit vector received or stored by a CAM 305, such as CAM 305-b as described with reference to FIG. 5. Additionally, bit vector 600-a may be fixed in-place and a copy may not be stored elsewhere.

The CAM 305 may split bit vector 600-a into one or more bit subvectors 605-a and a parity bit subvector 610. Parity bit subvector 610 may contain a number of bits representing an erasure or other error-correcting code or other parity information (e.g., even/odd parity, one or more Reed-Solomon codes, one or more product codes, one or more cyclic redundancy check (CRC) codes, one or more other error correcting, error detecting, or erasure codes, or any combination thereof) for (e.g., calculated based on) bit subvectors 605-a. The CAM 305 may store bit subvectors 605-a and the parity bit subvector 610 in memory cells 105 of consecutive column lines 115. Alternatively, the CAM 305 may store bit subvectors 605-a and parity bit subvector 610 in memory cells of different memory arrays 315. In some cases, some or each of the one or more bit subvectors 605-a and the parity bit subvector 610 may be stored across different memory devices (e.g., different CAMs 305). In some cases, the parity bit subvector 610 and each of the bit subvectors 605-a may have a same size (e.g., 32 bytes).

Generally, including the parity bit subvector 610 may decrease a chance of a false match. For instance, if one of the subvectors 605-a associated with the parity bit subvector 610 is identified a mismatch, the parity bit subvector 610 may also be identified as a mismatch. As such, a higher device or system may determine that bit subvectors 605-a and parity bit subvector 610 are not a match with a received vector with a higher degree of success.

Figure 6B:
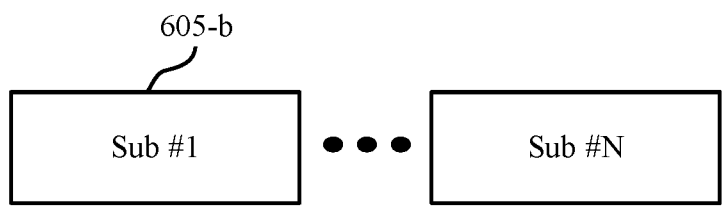

FIG. 6B illustrates an example of a bit vector 600-b that supports error control for CAM in accordance with examples as disclosed herein. Bit vector 600-b may be an example of a bit vector received or stored by a CAM 305, such as CAM 305-b described with reference to FIG. 5. Bit vector 600-*b* may not be fixed in place and a copy of bit vector 600-*b* may be stored elsewhere (e.g., in a DRAM).

The CAM 305 may split bit vector 600-*b* into one or more bit subvectors 605-*b* (e.g., 32 byte subvectors 605-*b*) without parity. The CAM 305 may store bit subvectors 605-*b* in memory cells 105 of consecutive column lines 115. Alternatively, the CAM 305 may store bit subvectors 605-*b* in memory cells 105 of different memory arrays 315. In some cases, some or each of the one or more bit subvectors 605-*b* may be stored across different memory devices (e.g., different CAMs 305).

Generally, not including parity may increase an amount of vectors that may be stored in the CAM 305. Additionally or alternatively, not including parity may enable the CAM 305 to search for the vector in a smaller amount of time.

Figure 7:
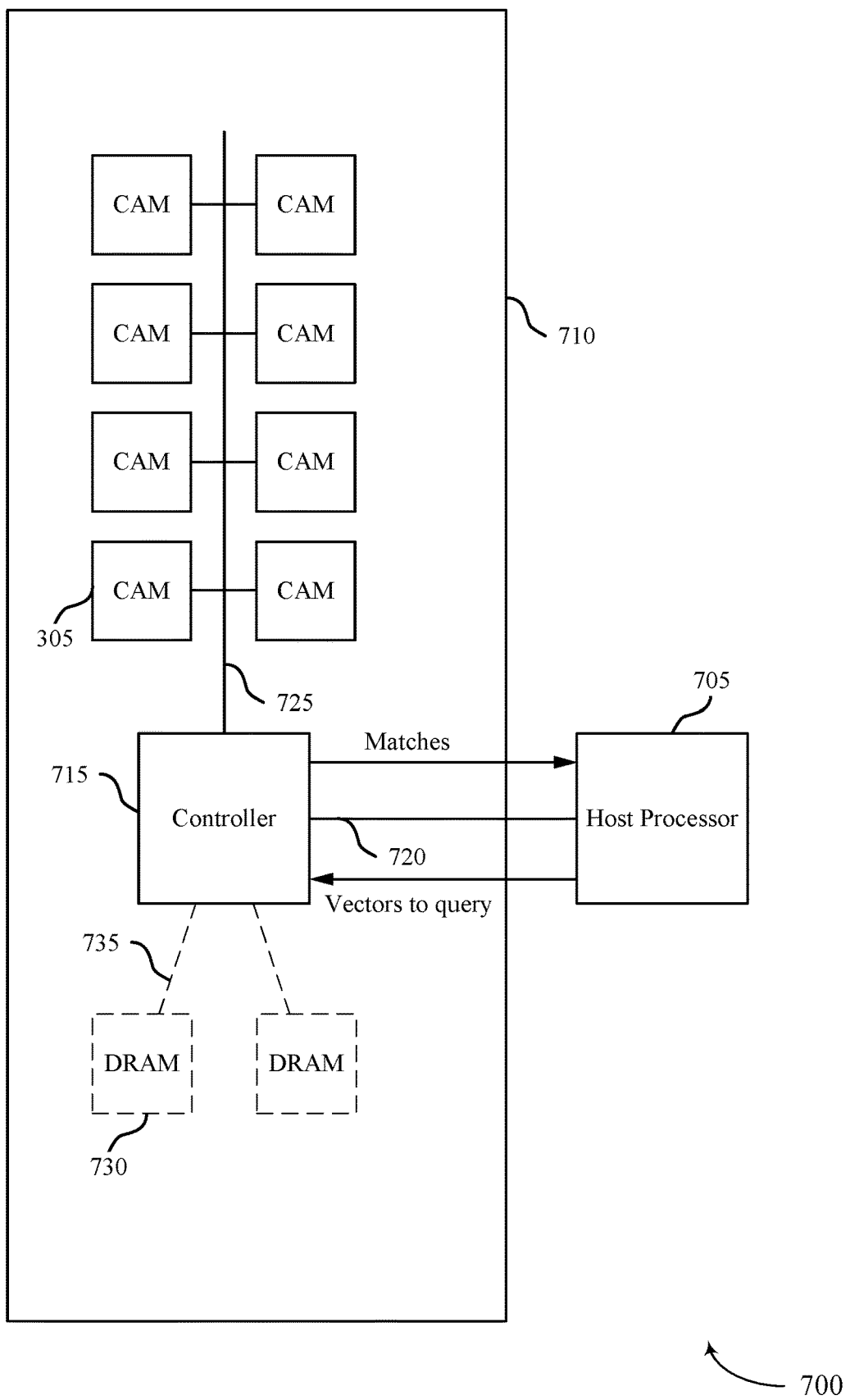
FIG. 7 illustrates an example of a media management system that supports error control for CAM in accordance with examples as disclosed herein.

FIG. 7 illustrates an example of a media management system 700 that supports error control for CAM in accordance with examples as disclosed herein. The media management system 700 may include a host processor 705 and an interfacing system 710. It is to be understood that, in some cases, one or more of the functions and structures ascribed herein interfacing system 710 may be generally implemented or provided by any device or system that includes one or more memory devices.

A host processor 705 may be a processor of a host device, such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. The host processor may be configured to provide commands for retrieving data from and storing data to a interfacing system 710. Additionally or alternatively, the host processor may be configured to provide bit vectors to query.

Interfacing system 710 may include a controller 715 and one or more CAMs 305. The controller 715 may be configured to receive bit vectors to query from host processor 705 over communication channel 720. Additionally, the controller 715 may be configured to transmit bit vectors to query to the one or more CAMs 305 over communication channel 725. The CAMs 305 may include self-selecting memory cells or may include any other type of memory cells, such as NAND flash memory cells. The controller 715 may be an FPGA, a central controller, a microcontroller with firmware, or other processor or logic circuitry. Communication channel 720 may be an example of an ethernet connection, a double data rate (DDR) interface connection, or another type of connection. In some cases, interfacing system 710 may be a peripheral component interconnect express (PCIe) card.

In some cases, controller 715 may be configured to segment the bit vectors to query into a set of bit subvectors and to transmit the set of bit subvectors to the one or more CAMs 305. Additionally, controller 715 may be configured to receive one or more matches (e.g., addresses or indices of column lines 115) from a CAM 305 over communication channel 725 and may be configured to transmit the matches or an indication thereof to host processor 705 over communication channel 720. In some cases, interfacing system 710 may include one or more DRAMs 730. Controller 715 may be configured to transmit commands and to transmit data to or receive data from the one or more DRAMs 730 over communication channels 735. Generally, the DRAMs 730 may be used as false-match filters (e.g., filters to distinguish false matches from true matches). In some cases, the media management system 700 may include and the functions ascribed herein to DRAMs 730 may be performed by memory arrays or devices of another type (e.g., FeRAM, PCM, self-selecting memory).

Figure 8:
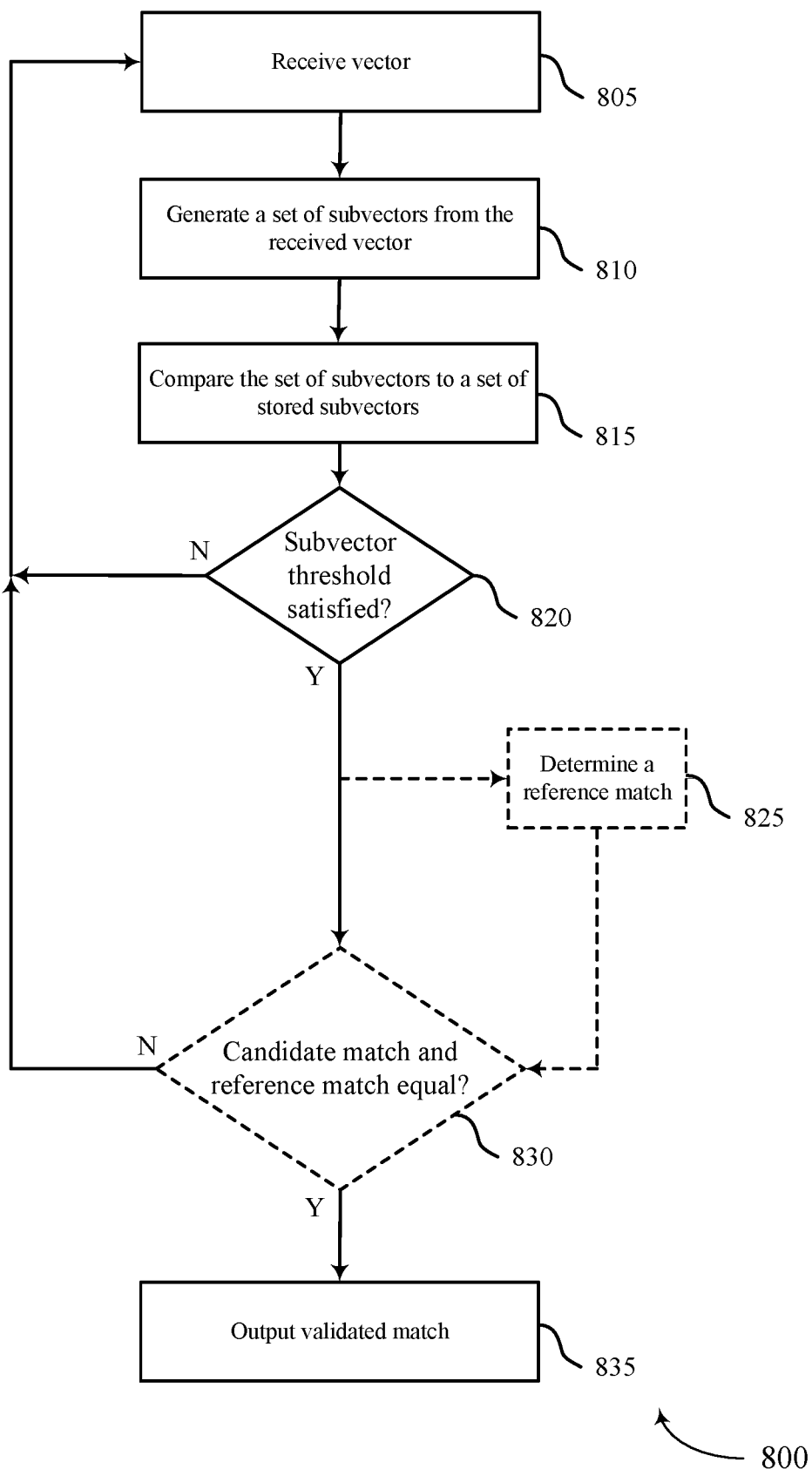
FIG. 8 illustrates an example of a matching process flow that supports error control for CAM in accordance with examples as disclosed herein.

FIG. 8 illustrates an example of a matching process flow 800 that supports error control for CAM in accordance with examples as disclosed herein. Matching process flow 800 may represent a process undertaken by the components of FIG. 7 to determine if a received bit vector matches a stored bit vector. In some cases, a matching process flow 800 may also be referred to as a CAM query.

In some cases, each bit subvector of a bit vector may be stored at a single CAM 305 within a same memory array or within different memory arrays. In other cases, bit subvectors of the bit vector may be stored in different memory devices (e.g., different CAMs 305). Generally, storing the bit subvectors at multiple memory devices may enable the controller 715 to determine whether a received bit vector matches a stored bit vector if one of the CAMs 305 storing a bit subvector of the stored bit vector fail.

At 805, a host processor 705 may provide bit vectors to query to an controller 715. The controller 715 may provide the bit vectors to a CAM 305, which may receive the bit vector over communication channel 725. Alternatively, the controller 715 may provide the bit vector to multiple CAMs 305 (e.g., if the bit vector is stored as bit subvectors over multiple CAMs 305).

At 810, the CAM 305 or set of CAMs 305 may generate a set of bit subvectors from the received bit vector, such as described with reference to FIG. 5. In some cases, the controller 715 may generate the set of bit subvectors and may provide the set of bit subvectors to the CAM 305 or set of CAMs 305 instead of the bit vector.

At 815, the CAM 305 or set of CAMs 305 may compare the set of generated bit subvectors to a set of bit subvectors stored at the CAM 305 or the set of CAMs 305, such as described with reference to FIG. 5. The CAM 305 or set of CAMs 305 may transmit addresses or indices of matching column lines 115 to controller 715, also such as described with reference to FIG. 5.

At 820, the controller 715 may determine if the quantity of stored bit subvectors that match at least one of the set of received bit subvectors satisfies (e.g., equals or exceeds) a threshold value. For instance, the controller 715 may tally the total number of addresses or indices which are received from the CAM 305 and/or the set of CAMs 305 and associated with the generated set of bit subvectors. To determine which received addresses or indices are associated with the bit vector received from host processor 705, the controller 715 may refer to a mapping table, which may be internal or external to controller 715, to decode which bit subvectors to use for comparing to the threshold. If the tally is equal to or higher than the threshold, the controller 715 may determine that the bit vector received from host processor 705 is a candidate match. If the tally is lower than the threshold, the controller 715 may report a mismatch to host processor 705.

In some cases (e.g., if each stored bit subvector is within one or more memory arrays 315 of a single CAM 305), a CAM 305 may determine if the quantity of stored bit subvectors that match at least one of the set of received bit subvectors are at or exceed a threshold value. In such cases, the CAM 305 may transmit the candidate match or an indication thereof to the controller 715.

At 825, the controller 715 may determine a reference match to compare to the candidate match. In some cases, the controller 715 may receive the reference match by performing a read operation on the CAM 305 using the addresses provided by the CAM 305. In some cases, the read may be an ECC read, in which the controller 715 or DRAM 730 may apply an ECC code to the reference match. Alternatively, the controller 715 may receive the reference match by performing a read operation on a DRAM 730 that contains a copy of the bit vector to which the stored bit subvectors correspond. In some cases, the controller 715 may map the addresses provided by the CAM 305 to an address of the DRAM 730. In some cases, the controller 715 may not determine a reference match and may output the addresses or index of the candidate match (e.g., may proceed directly to 835). If the controller 715 or a CAM 305 has detected a number of mismatches (between reference matches and candidate matches) exceeding a threshold number of allowable mismatches, the controller 715 or CAM 305 may perform one or more corrective actions.

At 830, the controller 715 may determine whether the candidate match is the same as the reference match. If the controller 715 reads from the one or more CAMs 305 at 825, the controller 715 may compare the subvectors received from the one or more CAMs 305 with the corresponding generated subvectors. If the controller 715 reads from a DRAM 730 at 825, meanwhile, the controller 715 may compare the bit vector received from the DRAM 730 with the bit vector received from the host processor 705. If the reference match is the same as the candidate match, the controller 715, at 835, may provide the candidate match or an indication thereof to host processor 705 over communication channel 720. If the reference match is different from the candidate match, the controller 715, at 835, may discard the candidate match and may continue providing bit vectors to query (e.g., may proceed to 805). In such cases, the controller 715 may report a mismatch to the host processor 705.

Performing the operations of 805 through 820 may enable the controller 715 to identify (distinguish) false mismatches from true mismatches. A true mismatch may occur when a generated subvector is correctly identified as not having a match. A false mismatch, meanwhile, may occur when one of the generated subvectors has a match, but is misidentified as not having a match. In such cases, having a threshold that is less than the total number of generated subvectors, such as described at 820, may enable the controller 715 to avoid false mismatches.

Performing the operations of 825 and 830 may also enable the controller 715 to identify (distinguish) false matches from true matches. A false match may occur when one of the generated subvectors is misidentified as having a match with a stored subvector (e.g., due to a memory cell 105 of the column line 115 of the stored subvector failing to exhibit snapback behavior).

Additionally or alternatively, false matches may occur if the controller 715, at 820, determines that the threshold quantity of subvectors is satisfied when any of the generated subvectors which are identified as not having a match actually did not match any subvectors stored at the one or more CAMs 305 (i.e., when a true mismatch occurs between a number of subvectors, but the number is sufficiently small that the threshold is nevertheless satisfied). For example, the controller 715 may identify that 8 out of 9 generated subvectors have a match stored at the one or more CAMs 305. If the threshold quantity of subvectors is 8 and the controller 715 does not perform the operations of 825 and 830, the controller 715 may incorrectly determine that the bit vector received from the host processor 705 and associated with the generated subvectors has a match stored at the one or more CAMs 305. However, by performing the operations of 825 and 830, the controller 715 may instead determine that the 1 generated subvector of the 9 previously identified as not having a match truly does not have a match, and thus—despite the threshold number of subvector matches being identified at 820—the bit vector received from the host processor 705 does not actually have a match stored at the one or more CAMs 305. Thus, the operations of 825 and 830 may aid in identifying a true mismatch in scenarios where the threshold evaluation of 820 would otherwise identify a false match.

One potential benefit of the methods described herein with regards to 825 and 830 is that the controller 715 may be able to perform an ECC operation for the reference match, thus enabling the reference match to undergo error control. For instance, the controller 715 may perform one or more ECC reads at the one or more CAMs 305 or the DRAM 730 when retrieving the reference match. As such, the candidate match may be compared against a bit vector that has or a set of bit subvectors that have undergone error control. For this and other reasons that may be appreciated by those of ordinary skill in the art, methods as described herein with regards to 825 and 830 may limit a number of false matches.

In some cases, media management hardware of media management system 700 may detect that a certain bit vector, bit subvector, or column line 115 has encountered an error a number of times exceeding a threshold when operating according to matching process flow 800. In such cases, the data stored in that column line, bit vector, or bit subvector may be rewritten. Additionally or alternatively, the bit vector, bit subvector, or column line 115 may be marked as bad, and the bit subvector or bit vector may be stored elsewhere within the CAM 305 or the media management system 700.

In general, encoding the data by splitting a bit vector to store into bit subvectors may limit a number of potential false matches when querying for an CAM bit vector and may guard against device failure (e.g., if bit subvectors are stored at multiple CAMs 305). As compared to any bit failures creating false mismatches, splitting the bit vector into bit subvectors may enable mismatch to occur in a well-defined number of columns while still enabling the retrieval of data. Additionally, encoding data as described herein may enable error detection and correction on a CAM 305, which may otherwise not have protection against errors due to one bit error ruling out a bit vector as a match. In general, encoding data as bit subvectors within a single CAM 305 may be associated with a lower energy or power than storing duplicates of bit vectors within multiple CAMs 305. If multiple bit subvectors are stored within a single CAM 305, media management system 700 may use fewer CAMs 305 than if bit subvectors are stored within multiple CAMs 305.

Figure 9:
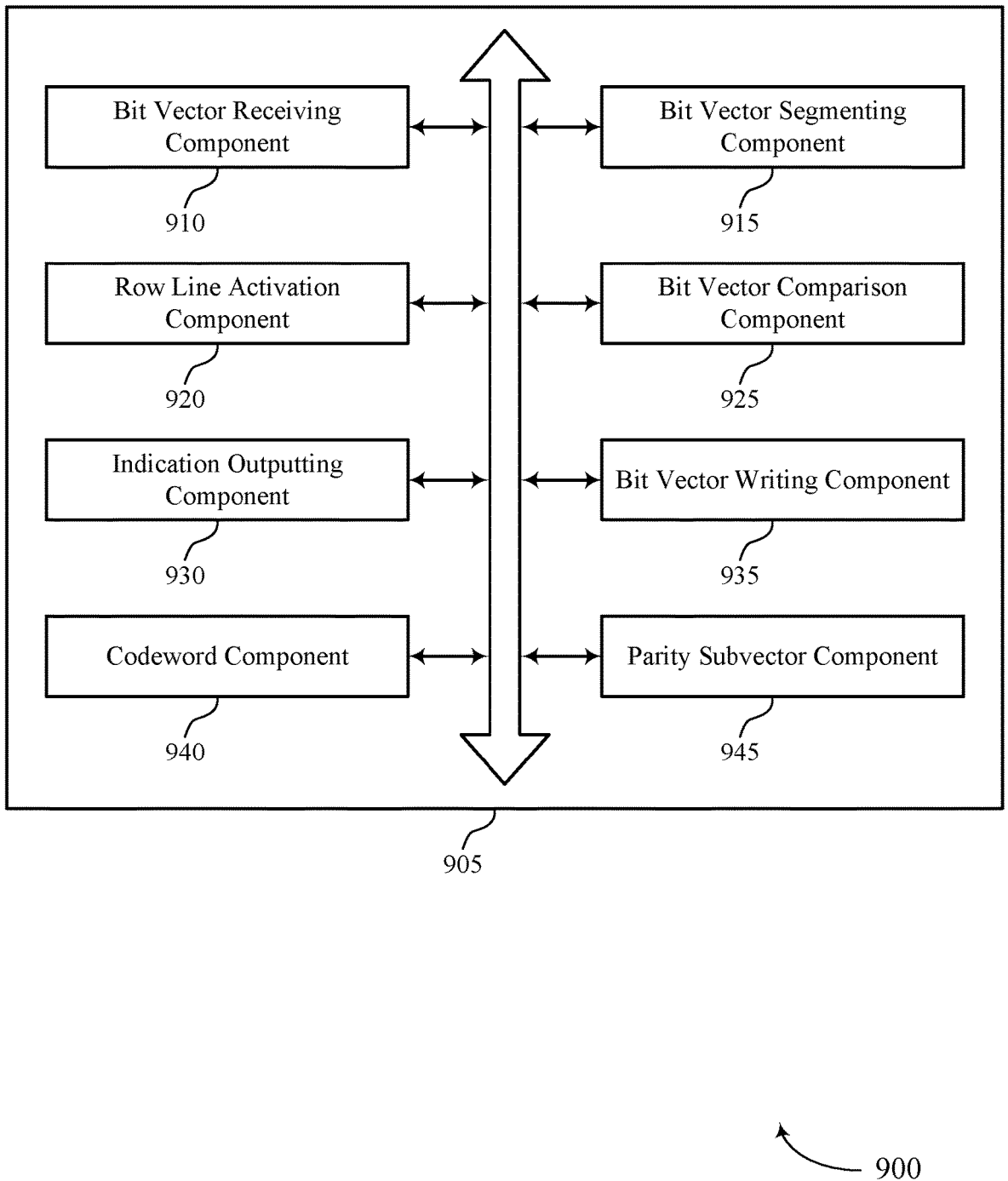
FIG. 9 shows a block diagram of a memory device that supports error control for CAM in accordance with examples as disclosed herein.

FIG. 9 shows a block diagram 900 of a memory device 905 that supports error control for CAM in accordance with examples as disclosed herein. The memory device 905 may be an example of a CAM as described with reference to FIGS. 3-5 and 7. The memory device 905 may include a bit vector receiving component 910, a bit vector segmenting component 915, a row line activation component 920, a bit vector comparison component 925, an indication outputting component 930, a bit vector writing component 935, a codeword component 940, and a parity subvector component 945. Each of these modules may communicate, directly or indirectly, with one another (e.g., via one or more buses).

The bit vector receiving component 910 may receive a bit vector at a CAM that stores a set of bit vectors and includes a set of row lines that extend in a first direction and a set of column lines that extend in a second direction. In some examples, receiving a bit vector at a CAM that includes a set of row lines that extend in a first direction and a set of column lines that extend in a second direction. In some cases, the set of column lines are each in a same memory array. In some cases, at least one of the set of column lines is in a first memory array and at least one other of the set of column lines is in a second memory array. In some cases, the CAM includes a set of memory cells each coupled with a row line of the set and a column line of the set. In some cases, each memory cell of the set includes a chalcogenide material configured to store one of a set of logic states based on a polarity of a write voltage applied to the chalcogenide material. In some cases, the chalcogenide material is configured to have a first threshold voltage when the write voltage has a first polarity and a second threshold voltage when the write voltage has a second polarity, the first threshold voltage and the second threshold voltage respectively corresponding to a first logic state and a second logic state of the set of logic states.

The bit vector segmenting component 915 may segment the received bit vector to obtain a set of received subvectors. In some examples, the bit vector segmenting component 915 may segment the bit vector to obtain a set of subvectors.

The row line activation component 920 may activate, for each received subvector of the set, the set of row lines using information included in the received subvector of the set. In some examples, the row line activation component 920 may activate the set of row lines using information included in a parity subvector that is based on the received bit vector. In some examples, the row line activation component 920 may identify an ordered set of bit values included in the received subvector. In some examples, the row line activation component 920 may set each of the set of row lines to a voltage level based on the ordered set of bit values. In some examples, the row line activation component 920 may activate the set of row lines using information included in a second received subvector of the set after activating the set of row lines in using the information included in a first received subvector of the set. In some examples, the row line activation component 920 may activate a first subset of the set of row lines using information included in a first received subvector of the set. In some examples, the row line activation component 920 may activate, concurrently with activating the first subset, a second subset of the set of row lines using information included in a second received subvector of the set.

The bit vector comparison component 925 may determine whether the received bit vector matches a stored bit vector based on the activating. In some examples, the bit vector comparison component 925 may compare the set of subvectors to target subvectors of a target bit vector. In some examples, the bit vector comparison component 925 may determine a quantity of stored subvectors that match at least one of the set of received subvectors. In some examples, the bit vector comparison component 925 may determine whether the received bit vector matches the stored bit vector based on the quantity of stored subvectors that match at least one of the set of received subvectors. In some examples, the bit vector comparison component 925 may compare the quantity of stored subvectors that match at least one of the set of received subvectors to a threshold. In some examples, the bit vector comparison component 925 may determine whether the received bit vector matches the stored bit vector based on the comparing to the threshold. In some examples, the bit vector comparison component 925 may determine whether the received bit vector matches the stored bit vector based on activating the set of row lines using the information included in the parity subvector. In some examples, the bit vector comparison component 925 may compare the corrected codeword to the received bit vector. In some examples, the bit vector comparison component 925 may determine whether the received bit vector matches the stored bit vector based on the comparing. In some cases, the threshold is smaller than a total number of received subvectors in the set.

The indication outputting component 930 may output an indication of whether the received bit vector matches the stored bit vector.

The bit vector writing component 935 may store the set of subvectors to respective columns of memory cells each coupled with a respective column line of the set. In some examples, the bit vector writing component 935 may write the set of stored subvectors to memory cells coupled with a corresponding set of column lines, where each stored subvector of the set is written to memory cells coupled with a respective column line of the set. In some examples, the bit vector writing component 935 may store the bit vector to memory cells of a second memory array.

The codeword component 940 may read memory cells associated with the stored bit vector to obtain a codeword. In some examples, the codeword component 940 may generate a corrected codeword based on the codeword and an ECC for the codeword.

The parity subvector component 945 may identify a parity subvector that is based on the bit vector. In some examples, the parity subvector component 945 may store the parity subvector to an additional column of memory cells coupled with an additional column line of the set.

Figure 10:
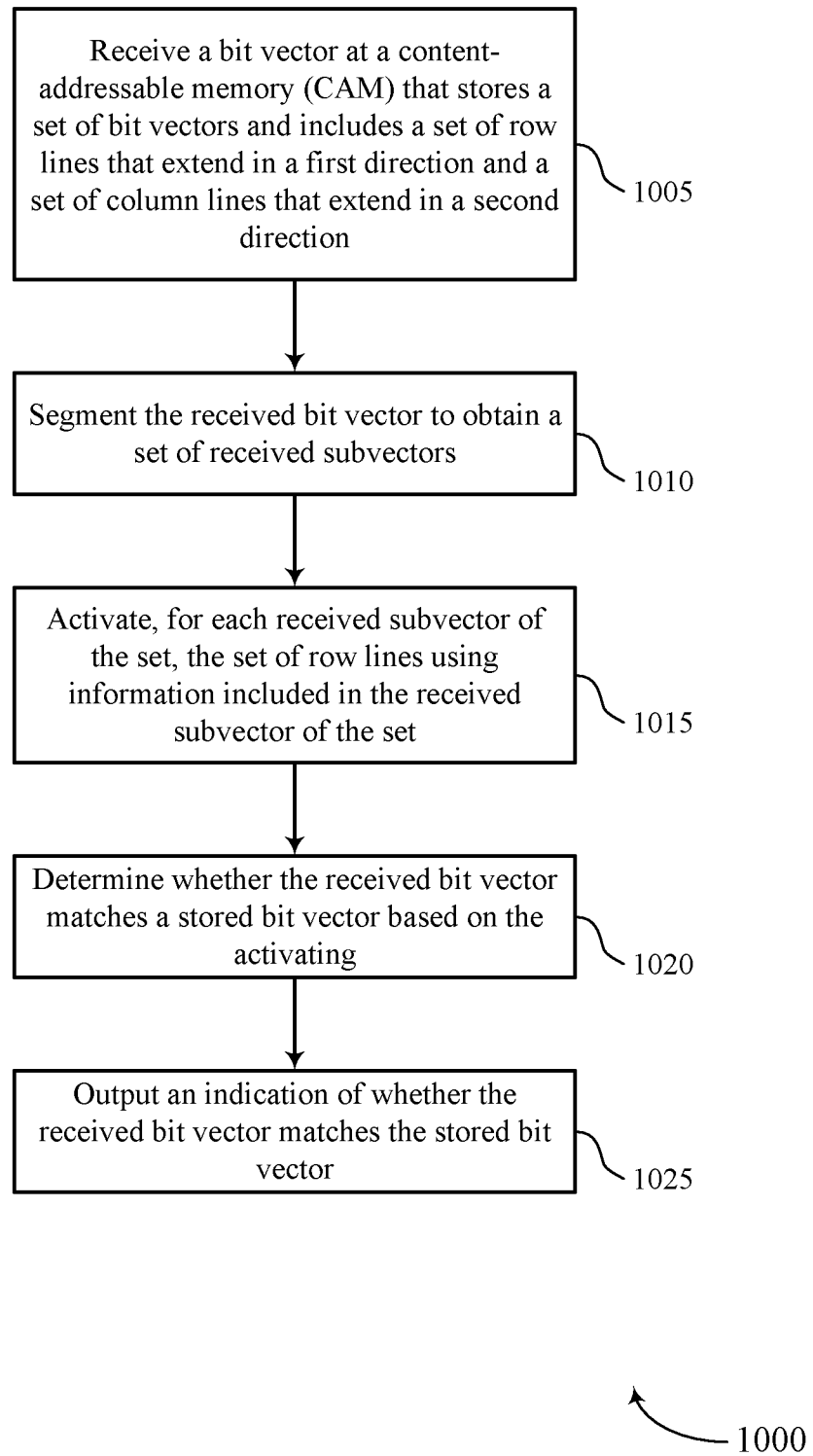
FIGS. 10 through 13 show flowcharts illustrating a method or methods that support error control for CAM in accordance with examples as disclosed herein.

FIG. 10 shows a flowchart illustrating a method or methods 1000 that supports error control for CAM in accordance with examples as disclosed herein. The operations of method 1000 may be implemented by a memory device or its components as described herein. For example, the operations of method 1000 may be performed by a memory device as described with reference to FIG. 9. In some examples, a memory device may execute a set of instructions to control the functional elements of the memory device to perform the described functions. Additionally or alternatively, a memory device may perform examples of the described functions using special-purpose hardware.

At 1005, the memory device may receive a bit vector at a CAM that stores a set of bit vectors and includes a set of row lines that extend in a first direction and a set of column lines that extend in a second direction. The operations of 1005 may be performed according to the methods described herein. In some examples, the operations of 1005 may be performed by a bit vector receiving component as described with reference to FIG. 9.

At 1010, the memory device may segment the received bit vector to obtain a set of received subvectors. The operations of 1010 may be performed according to the methods described herein. In some examples, the operations of 1010 may be performed by a bit vector segmenting component as described with reference to FIG. 9.

At 1015, the memory device may activate, for each received subvector of the set, the set of row lines using information included in the received subvector of the set. The operations of 1015 may be performed according to the methods described herein. In some examples, the operations of 1015 may be performed by a row line activation component as described with reference to FIG. 9.

At 1020, the memory device may determine whether the received bit vector matches a stored bit vector based on the activating. The operations of 1020 may be performed according to the methods described herein. In some examples, the operations of 1020 may be performed by a bit vector comparison component as described with reference to FIG. 9.

At 1025, the memory device may output an indication of whether the received bit vector matches the stored bit vector. The operations of 1025 may be performed according to the methods described herein. In some examples, the operations of 1025 may be performed by an indication outputting component as described with reference to FIG. 9.

In some examples, an apparatus as described herein may perform a method or methods, such as the method 1000. The apparatus may include features, means, or instructions (e.g., a non-transitory computer-readable medium storing instructions executable by a processor) for receiving a bit vector at a CAM that stores a set of bit vectors and includes a set of row lines that extend in a first direction and a set of column lines that extend in a second direction, segmenting the received bit vector to obtain a set of received subvectors, activating, for each received subvector of the set, the set of row lines using information included in the received subvector of the set, determining whether the received bit vector matches a stored bit vector based on the activating, and outputting an indication of whether the received bit vector matches the stored bit vector.

Some examples of the method 1000 and the apparatus described herein may further include operations, features, means, or instructions for writing the set of stored subvectors to memory cells coupled with a corresponding set of column lines, where each stored subvector of the set may be written to memory cells coupled with a respective column line of the set.

Some examples of the method 1000 and the apparatus described herein may further include operations, features, means, or instructions for determining a quantity of stored subvectors that match at least one of the set of received subvectors, and determining whether the received bit vector matches the stored bit vector based on the quantity of stored subvectors that match at least one of the set of received subvectors.

Some examples of the method 1000 and the apparatus described herein may further include operations, features, means, or instructions for comparing the quantity of stored subvectors that match at least one of the set of received subvectors to a threshold, and determining whether the received bit vector matches the stored bit vector based on the comparing to the threshold.

In some examples of the method 1000 and the apparatus described herein, the threshold may be smaller than a total number of received subvectors in the set.

Some examples of the method 1000 and the apparatus described herein may further include operations, features, means, or instructions for activating the set of row lines using information included in a parity subvector that may be based on the received bit vector, and determining whether the received bit vector matches the stored bit vector based on activating the set of row lines using the information included in the parity subvector.

Some examples of the method 1000 and the apparatus described herein may further include operations, features, means, or instructions for reading memory cells associated with the stored bit vector to obtain a codeword, generating a corrected codeword based on the codeword and an ECC for the codeword, comparing the corrected codeword to the received bit vector, and determining whether the received bit vector matches the stored bit vector based on the comparing.

In some examples of the method 1000 and the apparatus described herein, activating the set of row lines using the information included in the received subvector of the set may include operations, features, means, or instructions for identifying an ordered set of bit values included in the received subvector, and setting each of the set of row lines to a voltage level based on the ordered set of bit values.

In some examples of the method 1000 and the apparatus described herein, the set of column lines may be each in a same memory array.

In some examples of the method 1000 and the apparatus described herein, activating, for each received subvector of the set, the set of row lines may include operations, features, means, or instructions for activating the set of row lines using information included in a second received subvector of the set after activating the set of row lines in using the information included in a first received subvector of the set.

In some examples of the method 1000 and the apparatus described herein, at least one of the set of column lines may be in a first memory array and at least one other of the set of column lines may be in a second memory array.

In some examples of the method 1000 and the apparatus described herein, activating, for each received subvector of the set, the set of row lines may include operations, features, means, or instructions for activating a first subset of the set of row lines using information included in a first received subvector of the set, and activating, concurrently with activating the first subset, a second subset of the set of row lines using information included in a second received subvector of the set.

In some examples of the method 1000 and the apparatus described herein, the CAM includes a set of memory cells each coupled with a row line of the set and a column line of the set, each memory cell of the set includes a chalcogenide material configured to store one of a set of logic states based on a polarity of a write voltage applied to the chalcogenide material, and the chalcogenide material may be configured to may have a first threshold voltage when the write voltage may have a first polarity and a second threshold voltage when the write voltage may have a second polarity, the first threshold voltage and the second threshold voltage respectively corresponding to a first logic state and a second logic state of the set of logic states.

Figure 11:
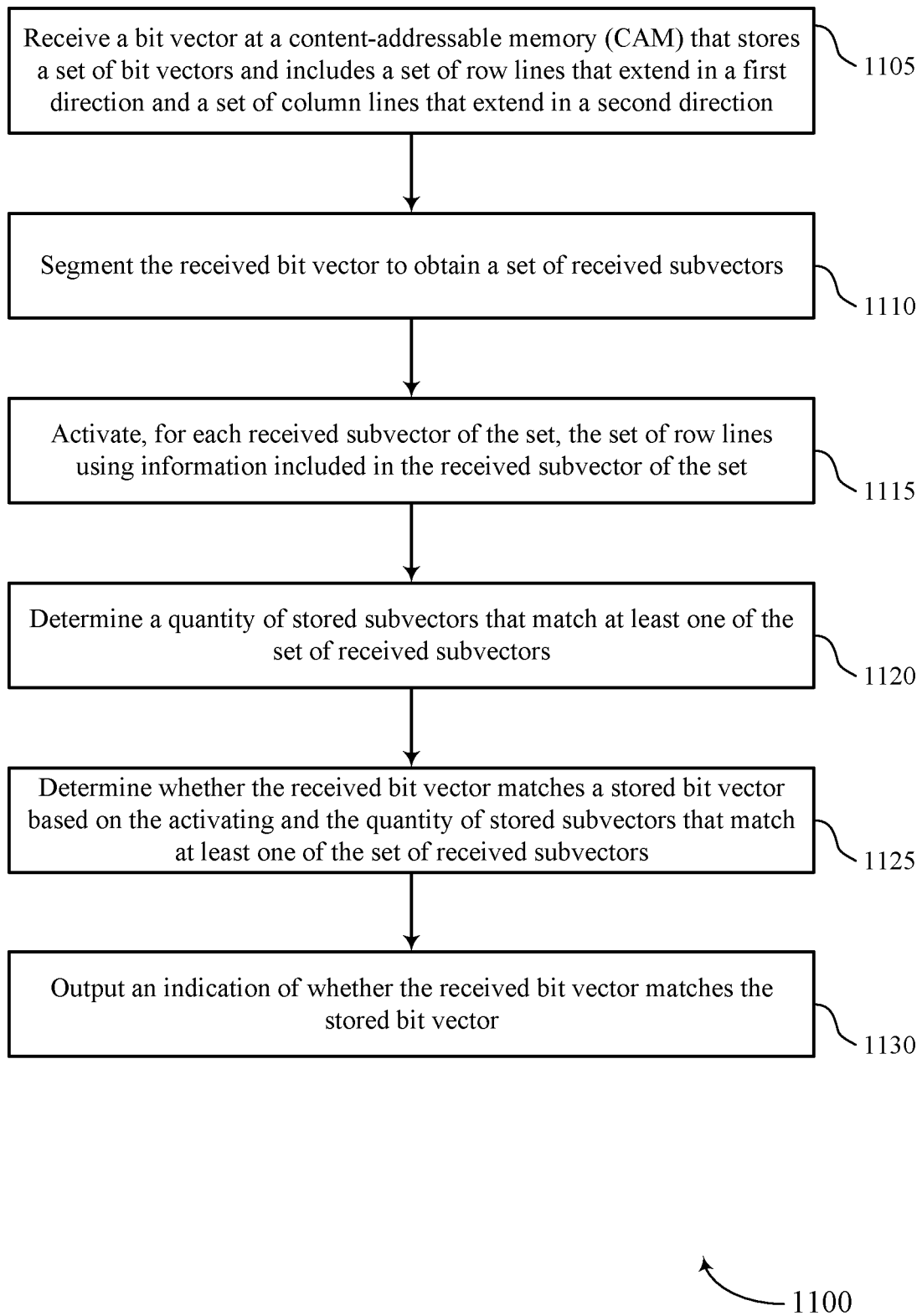

FIG. 11 shows a flowchart illustrating a method or methods 1100 that supports error control for CAM in accordance with examples as disclosed herein. The operations of method 1100 may be implemented by a memory device or its components as described herein. For example, the operations of method 1100 may be performed by a memory device as described with reference to FIG. 9. In some examples, a memory device may execute a set of instructions to control the functional elements of the memory device to perform the described functions. Additionally or alternatively, a memory device may perform the described functions using special-purpose hardware.

At 1105, the memory device may receive a bit vector at a CAM that stores a set of bit vectors and includes a set of row lines that extend in a first direction and a set of column lines that extend in a second direction. The operations of 1105 may be performed according to the methods described herein. In some examples, the operations of 1105 may be performed by a bit vector receiving component as described with reference to FIG. 9.

At 1110, the memory device may segment the received bit vector to obtain a set of received subvectors. The operations of 1110 may be performed according to the methods described herein. In some examples, the operations of 1110 may be performed by a bit vector segmenting component as described with reference to FIG. 9.

At 1115, the memory device may activate, for each received subvector of the set, the set of row lines using information included in the received subvector of the set. The operations of 1115 may be performed according to the methods described herein. In some examples, the operations of 1115 may be performed by a row line activation component as described with reference to FIG. 9.

At 1120, the memory device may determine a quantity of stored subvectors that match at least one of the set of received subvectors. The operations of 1120 may be performed according to the methods described herein. In some examples, the operations of 1120 may be performed by a bit vector comparison component as described with reference to FIG. 9.

At 1125, the memory device may determine whether the received bit vector matches a stored bit vector based on the activating and the quantity of stored subvectors that match at least one of the set of received subvectors. The operations of 1125 may be performed according to the methods described herein. In some examples, the operations of 1125 may be performed by a bit vector comparison component as described with reference to FIG. 9.

At 1130, the memory device may output an indication of whether the received bit vector matches the stored bit vector. The operations of 1130 may be performed according to the methods described herein. In some examples, the operations of 1130 may be performed by an indication outputting component as described with reference to FIG. 9.

Figure 12:
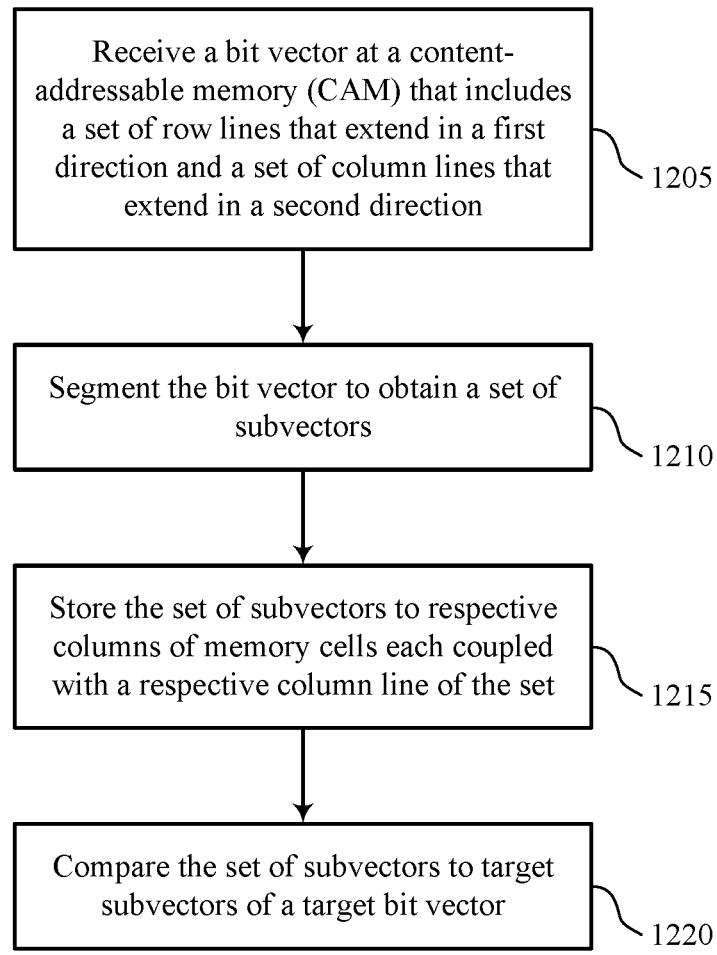

FIG. 12 shows a flowchart illustrating a method or methods 1200 that supports error control for CAM in accordance with examples as disclosed herein. The operations of method 1200 may be implemented by a memory device or its components as described herein. For example, the operations of method 1200 may be performed by a memory device as described with reference to FIG. 9. In some examples, a memory device may execute a set of instructions to control the functional elements of the memory device to perform the described functions. Additionally or alternatively, a memory device may perform the described functions using special-purpose hardware.

At 1205, the memory device may receive a bit vector at a CAM that includes a set of row lines that extend in a first direction and a set of column lines that extend in a second direction. The operations of 1205 may be performed according to the methods described herein. In some examples, the operations of 1205 may be performed by a bit vector receiving component as described with reference to FIG. 9.

At 1210, the memory device may segment the bit vector to obtain a set of subvectors. The operations of 1210 may be performed according to the methods described herein. In some examples, the operations of 1210 may be performed by a bit vector segmenting component as described with reference to FIG. 9.

At 1215, the memory device may store the set of subvectors to respective columns of memory cells each coupled with a respective column line of the set. The operations of 1215 may be performed according to the methods described herein. In some examples, the operations of 1215 may be performed by a bit vector writing component as described with reference to FIG. 9.

At 1220, the memory device may compare the set of subvectors to target subvectors of a target bit vector. The operations of 1220 may be performed according to the methods described herein. In some examples, the operations of 1220 may be performed by a bit vector comparison component as described with reference to FIG. 9.

In some examples, an apparatus as described herein may perform a method or methods, such as the method 1200. The apparatus may include features, means, or instructions (e.g., a non-transitory computer-readable medium storing instructions executable by a processor) for receiving a bit vector at a CAM that includes a set of row lines that extend in a first direction and a set of column lines that extend in a second direction, segmenting the bit vector to obtain a set of subvectors, storing the set of subvectors to respective columns of memory cells each coupled with a respective column line of the set, and comparing the set of subvectors to target subvectors of a target bit vector.

Some examples of the method 1200 and the apparatus described herein may further include operations, features, means, or instructions for identifying a parity subvector that may be based on the bit vector, and storing the parity subvector to an additional column of memory cells coupled with an additional column line of the set.

In some examples of the method 1200 and the apparatus described herein, the CAM may include operations, features, means, or instructions for storing the bit vector to memory cells of a second memory array.

Figure 13:
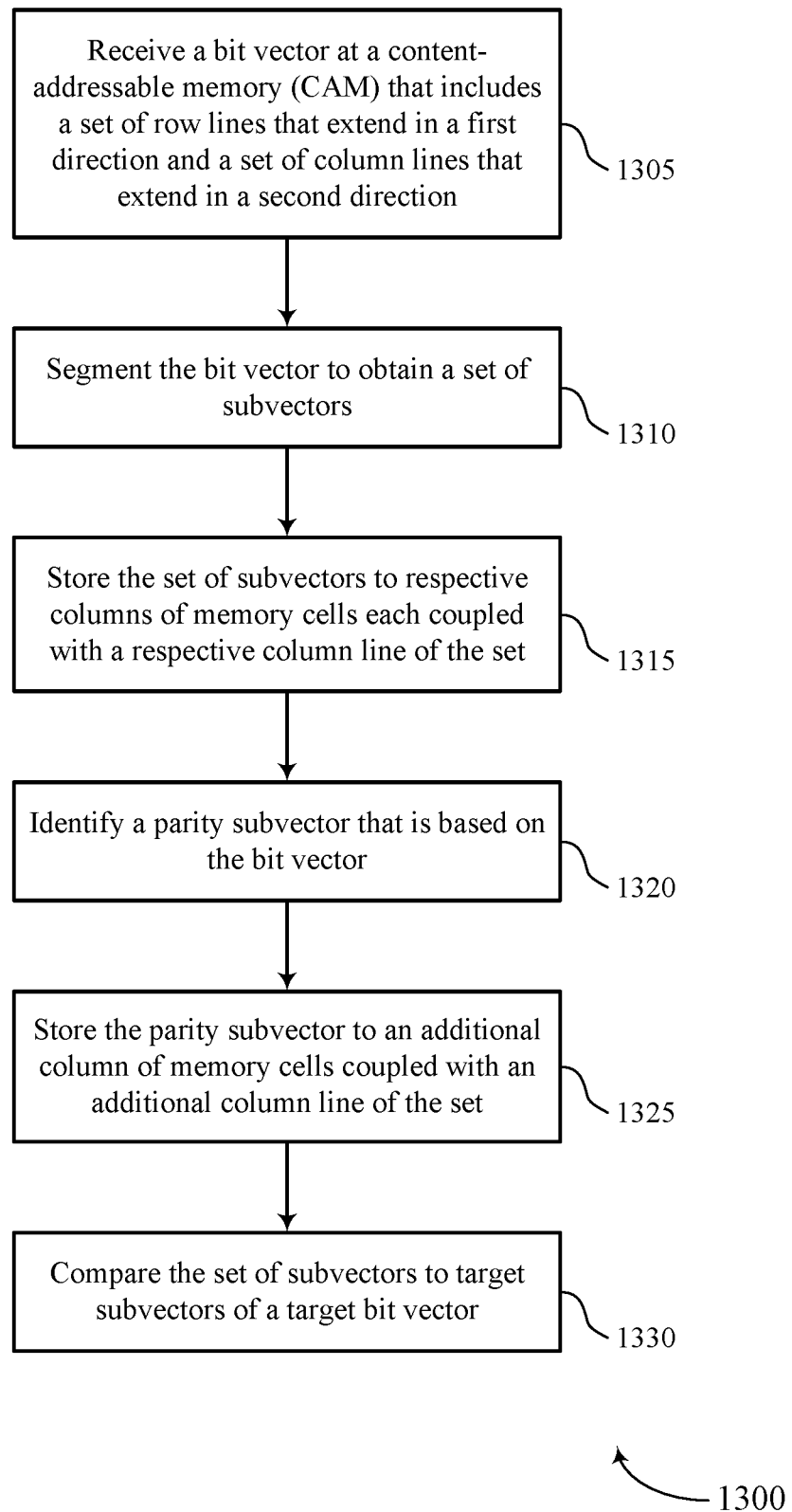

FIG. 13 shows a flowchart illustrating a method or methods 1300 that supports error control for CAM in accordance with examples as disclosed herein. The operations of method 1300 may be implemented by a memory device or its components as described herein. For example, the operations of method 1300 may be performed by a memory device as described with reference to FIG. 9. In some examples, a memory device may execute a set of instructions to control the functional elements of the memory device to perform the described functions. Additionally or alternatively, a memory device may perform the described functions using special-purpose hardware.

At 1305, the memory device may receive a bit vector at a CAM that includes a set of row lines that extend in a first direction and a set of column lines that extend in a second direction. The operations of 1305 may be performed according to the methods described herein. In some examples, the operations of 1305 may be performed by a bit vector receiving component as described with reference to FIG. 9.

At 1310, the memory device may segment the bit vector to obtain a set of subvectors. The operations of 1310 may be performed according to the methods described herein. In some examples, the operations of 1310 may be performed by a bit vector segmenting component as described with reference to FIG. 9.

At 1315, the memory device may store the set of subvectors to respective columns of memory cells each coupled with a respective column line of the set. The operations of 1315 may be performed according to the methods described herein. In some examples, the operations of 1315 may be performed by a bit vector writing component as described with reference to FIG. 9.

At 1320, the memory device may identify a parity subvector that is based on the bit vector. The operations of 1320 may be performed according to the methods described herein. In some examples, the operations of 1320 may be performed by a parity subvector component as described with reference to FIG. 9.

At 1325, the memory device may store the parity subvector to an additional column of memory cells coupled with an additional column line of the set. The operations of 1325 may be performed according to the methods described herein. In some examples, the operations of 1325 may be performed by a parity subvector component as described with reference to FIG. 9.

At 1330, the memory device may compare the set of subvectors to target subvectors of a target bit vector. The operations of 1330 may be performed according to the methods described herein. In some examples, the operations of 1330 may be performed by a bit vector comparison component as described with reference to FIG. 9.

It should be noted that the methods described above describe possible implementations, and that the operations and the steps may be rearranged or otherwise modified and that other implementations are possible. Further, portions from two or more of the methods may be combined.

An apparatus is described. The apparatus may include a CAM including a set of columns of memory cells, a write component coupled with the CAM and operable to write, for a set of bit vectors, subvectors of a corresponding set of subvectors to respective columns of the set, and a query component coupled with the CAM and operable to, for a target bit vector segment the target bit vector to obtain a set of target subvectors, determine, for the set of target subvectors, a quantity of columns of the set that store subvectors each matching a respective one of the set of target subvectors, and identify a bit vector stored by the CAM as matching the target bit vector based on the determined quantity of columns.

Some examples of the apparatus may include a validation component operable to identify a reference bit vector based on identifying the stored bit vector as matching the target bit vector.

Some examples may further include comparing the target bit vector to the reference bit vector, and identify the stored bit vector as a validated match for the target bit vector based on comparing the target bit vector to the reference bit vector.

Some examples may further include performing an error correcting procedure on the reference bit vector before comparing the stored bit vector to the reference bit vector.

In some examples, the validation component may be operable to identify the reference bit vector based on indices of columns included in the determined quantity of columns.

In some examples, the validation component may be further operable to read the CAM to obtain the reference bit vector.

In some examples, the CAM includes a first memory array, and where the validation component may be further operable to read a second memory array to obtain the reference bit vector.

In some examples, the first memory array includes memory cells of a first type, and where the second memory array includes memory cells of a second type.

In some examples, the memory cells of the first type include a chalcogenide material, and where the memory cells of the second type include dynamic random access memory (DRAM) memory cells.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    receiving a bit vector at a content-addressable memory (CAM) that stores a plurality of bit vectors and comprises a plurality of row lines and a plurality of column lines;
    segmenting the received bit vector to obtain a plurality of received subvectors;
    activating, for each received subvector of the plurality, the plurality of row lines using information included in the received subvector of the plurality, wherein activating the plurality of row lines using the information included in the received subvector of the plurality comprises setting each of the plurality of row lines to a voltage level based at least in part on an ordered set of bit values included in the received subvector; and
    outputting an indication of whether the received bit vector matches a stored bit vector based at least in part on activating the plurality of row lines.

2. The method of claim 1, wherein each stored bit vector corresponds to a plurality of stored subvectors, further comprising:
    writing the plurality of stored subvectors to memory cells coupled with a corresponding plurality of column lines, wherein each stored subvector of the plurality is written to memory cells coupled with a respective column line of the plurality.

3. The method of claim 1, wherein each stored bit vector corresponds to a plurality of stored subvectors, further comprising:
    determining a quantity of stored subvectors that match at least one of the plurality of received subvectors; and
    determining whether the received bit vector matches the stored bit vector based at least in part on the quantity of stored subvectors that match at least one of the plurality of received subvectors.

4. The method of claim 3, further comprising:
    comparing the quantity of stored subvectors that match at least one of the plurality of received subvectors to a threshold; and
    determining whether the received bit vector matches the stored bit vector based at least in part on the comparing to the threshold.

5. The method of claim 4, wherein the threshold is smaller than a total number of received subvectors in the plurality.

6. The method of claim 1, further comprising:
    activating the plurality of row lines using information included in a parity subvector that is based at least in part on the received bit vector; and
    determining whether the received bit vector matches the stored bit vector based at least in part on activating the plurality of row lines using the information included in the parity subvector.

7. The method of claim 1, further comprising:
    reading memory cells associated with the stored bit vector to obtain a codeword;
    generating a corrected codeword based at least in part on the codeword and an error correcting code (ECC) for the codeword;
    comparing the corrected codeword to the received bit vector; and
    determining whether the received bit vector matches the stored bit vector based at least in part on the comparing.

8. The method of claim 1, wherein activating the plurality of row lines using the information included in the received subvector of the plurality comprises:
    identifying an ordered set of bit values included in the received subvector.

9. The method of claim 1, wherein the plurality of column lines are each in a same memory array.

10. The method of claim 9, wherein activating, for each received subvector of the plurality, the plurality of row lines comprises:
    activating the plurality of row lines using information included in a second received subvector of the plurality after activating the plurality of row lines in using the information included in a first received subvector of the plurality.

11. The method of claim 1, wherein at least one of the plurality of column lines is in a first memory array and at least one other of the plurality of column lines is in a second memory array.

12. The method of claim 11, wherein activating, for each received subvector of the plurality, the plurality of row lines comprises:
    activating a first subset of the plurality of row lines using information included in a first received subvector of the plurality; and
    activating, concurrently with activating the first subset, a second subset of the plurality of row lines using information included in a second received subvector of the plurality.

13. An apparatus, comprising:
    a content-addressable memory (CAM) comprising a plurality of columns of memory cells;
    a write component coupled with the CAM and operable to write, for a plurality of bit vectors, subvectors of a corresponding set of subvectors to respective columns of the plurality; and
    a query component coupled with the CAM and operable to, for a target bit vector:
        segment the target bit vector to obtain a plurality of target subvectors; and
        identify a bit vector stored by the CAM as matching the target bit vector.

14. The apparatus of claim 13, further comprising:
    a validation component operable to identify a reference bit vector based at least in part on identifying the stored bit vector as matching the target bit vector.

15. The apparatus of claim 14, wherein the validation component is further operable to:
    compare the target bit vector to the reference bit vector; and
    identify the stored bit vector as a validated match for the target bit vector based at least in part on comparing the target bit vector to the reference bit vector.

16. The apparatus of claim 15, wherein the validation component is further operable to:
    perform an error correcting procedure on the reference bit vector before comparing the stored bit vector to the reference bit vector.

17. The apparatus of claim 14, wherein the validation component is further operable to read the CAM to obtain the reference bit vector.

18. An apparatus, comprising:
a controller associated with a memory device, wherein the controller is configured to cause the apparatus to:
receive a bit vector at a content-addressable memory (CAM) that stores a plurality of bit vectors and comprises a plurality of row lines and a plurality of column lines;
segment the received bit vector to obtain a plurality of received subvectors;
activate, for each received subvector of the plurality, the plurality of row lines using information included in the received subvector of the plurality, wherein activating the plurality of row lines using the information included in the received subvector of the plurality comprises setting each of the plurality of row lines to a voltage level based at least in part on an ordered set of bit values included in the received subvector; and
output an indication of whether the received bit vector matches a stored bit vector based at least in part on activating the plurality of row lines.

19. The apparatus of claim 18, wherein each stored bit corresponds to a plurality of stored subvectors, and wherein the controller further configured to cause the apparatus to:
write the plurality of stored subvectors to memory cells coupled with a corresponding plurality of column lines, wherein each stored subvector of the plurality is written to memory cells coupled with a respective column line of the plurality.

20. The apparatus of claim 18, wherein each stored bit vector corresponds to a plurality of stored bit vectors, and wherein the controller is further configured to cause the apparatus to:
determine a quantity of stored subvectors that match at least one of the plurality of received subvectors; and
determine whether the received bit vector matches the stored bit vector based at least in part on the quantity of stored subvectors that match at least one of the plurality of received subvectors.

* * * * *